(12) United States Patent
Ikeda et al.

(10) Patent No.: US 11,961,979 B2
(45) Date of Patent: Apr. 16, 2024

(54) SEMICONDUCTOR DEVICE

(71) Applicant: SEMICONDUCTOR ENERGY LABORATORY CO., LTD., Atsugi (JP)

(72) Inventors: Takayuki Ikeda, Kanagawa (JP);
Munehiro Kozuma, Kanagawa (JP);
Takanori Matsuzaki, Kanagawa (JP);
Ryota Tajima, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 504 days.

(21) Appl. No.: 16/973,666

(22) PCT Filed: Jul. 3, 2019

(86) PCT No.: PCT/IB2019/055659
§ 371 (c)(1),
(2) Date: Dec. 9, 2020

(87) PCT Pub. No.: WO2020/012296
PCT Pub. Date: Jan. 16, 2020

(65) Prior Publication Data
US 2021/0249703 A1  Aug. 12, 2021

(30) Foreign Application Priority Data

Jul. 10, 2018 (JP) .................................. 2018-130780

(51) Int. Cl.
*H01M 10/44* (2006.01)
*H01L 27/12* (2006.01)
(Continued)

(52) U.S. Cl.
CPC ...... *H01M 10/443* (2013.01); *H01L 27/1207* (2013.01); *H01L 27/1225* (2013.01);
(Continued)

(58) Field of Classification Search
CPC .............. H01M 10/443; H01M 10/486; H01L 27/1225; H01L 29/24; H01L 29/7869
See application file for complete search history.

(56) References Cited

U.S. PATENT DOCUMENTS 5,345,392 A * 9/1994 Mito .................. G01R 31/3648
340/636.15
5,900,717 A * 5/1999 Lee .................... H02J 7/007194
320/153
(Continued)

FOREIGN PATENT DOCUMENTS

CN        001930634 A      3/2007
CN        103098198 A      5/2013
(Continued)

OTHER PUBLICATIONS

International Search Report (Application No. PCT/IB2019/055659) dated Sep. 24, 2019.
(Continued)

*Primary Examiner* — David V Henze-Gongola
(74) *Attorney, Agent, or Firm* — NIXON PEABODY LLP; Jeffrey L. Costellia

(57) ABSTRACT

A semiconductor device capable of charging that is less likely to cause deterioration of a power storage device is provided.
The amount of a charging current is adjusted in accordance with the ambient temperature. Charging under low-temperature environments is performed with a reduced charging current. When the ambient temperature is too low or too high, the charging is stopped. Measurement of the ambient temperature is performed with a memory element using an oxide semiconductor. The use of a memory element using an oxide semiconductor enables measurement of the ambient
(Continued)

temperature and retention of the temperature information to be performed at the same time.

6 Claims, 16 Drawing Sheets

(51) Int. Cl.
*H01L 29/24* (2006.01)
*H01L 29/786* (2006.01)
*H01M 10/48* (2006.01)
*H02J 7/00* (2006.01)
*H10B 99/00* (2023.01)

(52) U.S. Cl.
CPC ........ *H01L 27/124* (2013.01); *H01L 27/1255* (2013.01); *H01L 29/24* (2013.01); *H01L 29/78648* (2013.01); *H01L 29/7869* (2013.01); *H01M 10/48* (2013.01); *H01M 10/486* (2013.01); *H02J 7/0047* (2013.01); *H10B 99/00* (2023.02)

(56) References Cited

U.S. PATENT DOCUMENTS

| | | | |
|---|---|---|---|
| 7,411,830 | B2 | 8/2008 | Takeuchi et al. |
| 8,422,272 | B2 | 4/2013 | Inoue. et al. |
| 8,597,830 | B2 | 12/2013 | Kawakami et al. |
| 8,749,204 | B2 | 6/2014 | Majima et al. |
| 8,785,931 | B2 | 7/2014 | Kinouchi et al. |
| 8,902,640 | B2 | 12/2014 | Inoue et al. |
| 9,299,813 | B2 | 3/2016 | Inoue et al. |
| 9,310,866 | B2 | 4/2016 | Koyama et al. |
| 9,435,696 | B2 | 9/2016 | Koyama et al. |
| 9,525,051 | B2 | 12/2016 | Inoue et al. |
| 9,825,037 | B2 | 11/2017 | Inoue et al. |
| 2001/0002707 | A1 | 6/2001 | Kumashiro |
| 2013/0326244 | A1 | 12/2013 | Koyama et al. |
| 2021/0126473 | A1 | 4/2021 | Ikeda et al. |
| 2021/0391604 | A1 | 12/2021 | Matsuzaki et al. |

FOREIGN PATENT DOCUMENTS

| | | |
|---|---|---|
| CN | 105869667 A | 8/2016 |
| EP | 2416323 A | 2/2012 |
| EP | 3151244 A | 4/2017 |
| JP | 10-126976 A | 5/1998 |
| JP | 2001-160622 A | 6/2001 |
| JP | 2010-066161 A | 3/2010 |
| JP | 2011-095087 A | 5/2011 |
| JP | 2012-009418 A | 1/2012 |
| JP | 2012-230040 A | 11/2012 |
| JP | 2014-039240 A | 2/2014 |
| JP | 2017-184352 A | 10/2017 |
| KR | 10-0263551 | 8/2000 |
| KR | 2015-0023547 A | 3/2015 |
| WO | WO-2006/075202 | 7/2006 |
| WO | WO-2013/180016 | 12/2013 |
| WO | WO-2013180016 A1 * | 12/2013 ............... G06F 1/26 |

OTHER PUBLICATIONS

Written Opinion (Application No. PCT/IB2019/055659) dated Sep. 24, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, p. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.
Deng.W et al., "A Core Compact Model for IGZO TFTs Considering Degeneration Mechanism", IEEE Transactions on Electron Devices, Feb. 13, 2018, vol. 65, No. 4, pp. 1370-1376.
Chinese Office Action (Application No. 201980042318.7) DATED Jan. 21, 2024.

* cited by examiner

600

FIG. 16A
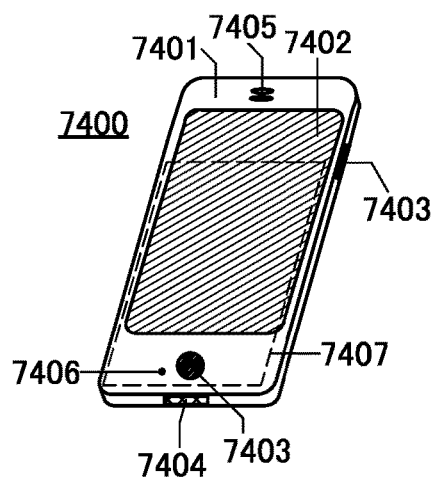
FIG. 16B
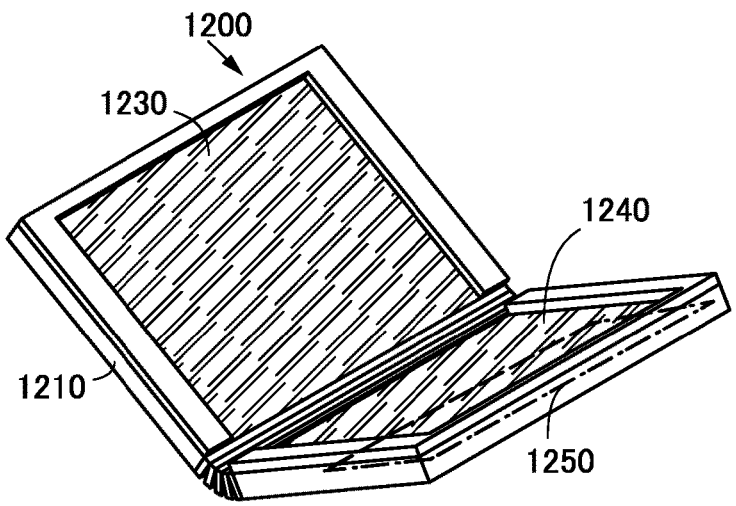
FIG. 16C
FIG. 16D
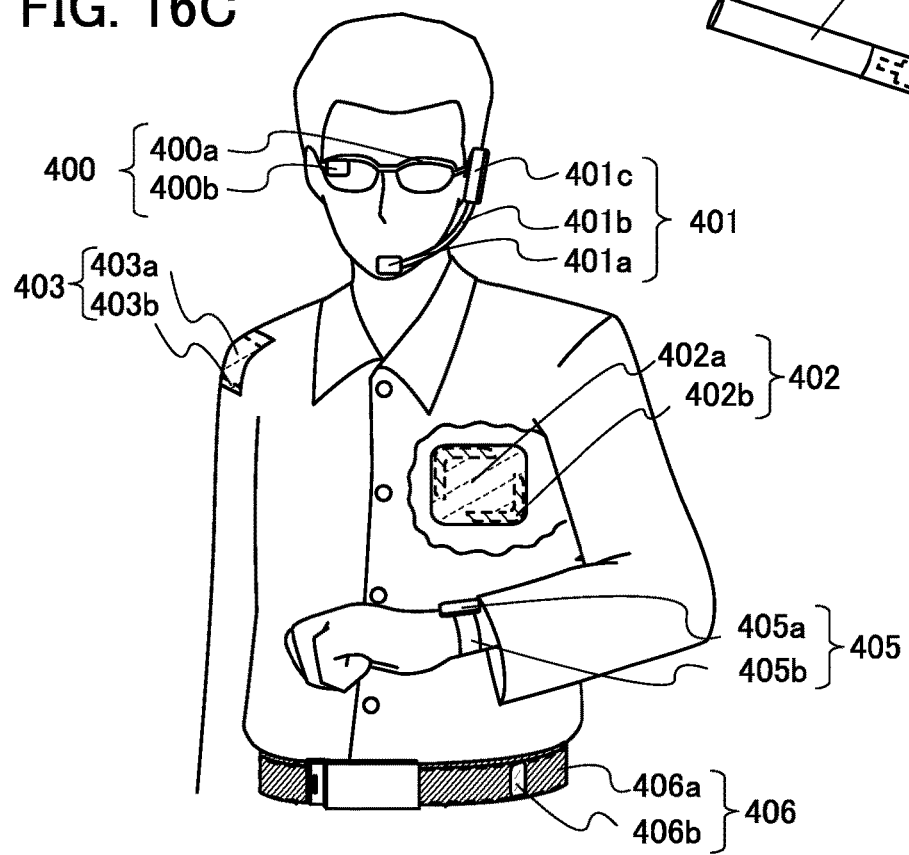

SEMICONDUCTOR DEVICE

TECHNICAL FIELD

One embodiment of the present invention relates to an object, a method, or a manufacturing method. One embodiment of the present invention relates to a process, a machine, manufacture, or a composition of matter. One embodiment of the present invention relates to a semiconductor device, a display device, a light-emitting device, a power storage device, a lighting device, or an electronic device. One embodiment of the present invention relates to a charge control method for a power storage device. One embodiment of the present invention relates to a charging device.

Note that in this specification, a power storage device (also referred to as "battery" or "secondary battery") generally refers to elements and devices having a function of storing power. For example, the power storage device includes a storage battery (also referred to as secondary battery) such as a lithium-ion secondary battery, a lithium-ion capacitor, a nickel hydrogen battery, an all-solid-state battery, and an electric double layer capacitor.

BACKGROUND ART

A silicon-based semiconductor material is widely known as a semiconductor thin film that can be used in a transistor, and as another material, an oxide semiconductor (OS) has attracted attention. Examples of oxide semiconductors include not only single-component metal oxides, such as indium oxide and zinc oxide, but also multi-component metal oxides. Among the multi-component metal oxides, an In—Ga—Zn oxide (hereinafter also referred to as IGZO) in particular has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Documents 1 to 3). In Non-Patent Documents 1 and 2, a technique for fabricating a transistor using an oxide semiconductor having the CAAC structure is disclosed. Moreover, Non-Patent Documents 4 and 5 describe that a fine crystal is included even in an oxide semiconductor which has lower crystallinity than an oxide semiconductor with the CAAC structure or the nc structure.

In addition, a transistor which includes IGZO as an active layer has an extremely low off-state current (see Non-Patent Document 6), and an LSI and a display utilizing the transistor characteristics have been reported (see Non-Patent Documents 7 and 8).

A variety of semiconductor devices utilizing a transistor including an oxide semiconductor in its channel formation region (hereinafter also referred to as an "OS transistor") have been proposed.

In recent years, various power storage units including secondary batteries such as lithium-ion secondary batteries, lithium-ion capacitors, and air cells have been actively developed. In particular, demand for lithium-ion secondary batteries with high output and high energy density has rapidly grown with the development of the semiconductor industry, for electrical devices, for example, portable information terminals such as mobile phones, smartphones, and laptop personal computers, portable music players, and digital cameras; medical equipment; next-generation clean energy vehicles such as hybrid electric vehicles (HEVs), electric vehicles (EVs), and plug-in hybrid electric vehicles (PHEVs); and the like. The lithium-ion secondary batteries are essential as rechargeable energy supply sources for today's information society.

The performance required for lithium-ion secondary batteries includes increased energy density, improved cycle performance, safe operation under a variety of operation environments, and longer-term reliability.

A lithium-ion battery includes, as an example, at least a positive electrode, a negative electrode, and an electrolyte solution (Patent Document 1).

Patent Document 2 discloses a battery state detector that detects micro short circuit of a secondary battery and a battery pack incorporating the same.

REFERENCE

Patent Document

[Patent Document 1] Japanese Published Patent Application No. 2012-9418
[Patent Document 2] Japanese Published Patent Application No. 2010-66161

Non-Patent Document

[Non-Patent Document 1] S. Yamazaki et al., "SID Symposium Digest of Technical Papers", 2012, volume 43, issue 1, p.183-186
[Non-Patent Document 2] S. Yamazaki et al., "Japanese Journal of Applied Physics", 2014, volume 53, Number 4S, p. 04ED18-1-04ED18-10
[Non-Patent Document 3] S. Ito et al., "The Proceedings of AM-FPD'13 Digest of Technical Papers", 2013, p.151-154
[Non-Patent Document 4] S. Yamazaki et al., "ECS Journal of Solid State Science and Technology", 2014, volume 3, issue 9, p.Q3012-Q3022
[Non-Patent Document 5] S. Yamazaki, "ECS Transactions", 2014, volume 64, issue 10, p.155-164
[Non-Patent Document 6] K. Kato et al., "Japanese Journal of Applied Physics", 2012, volume 51, p.021201-1-021201-7
[Non-Patent Document 7] S. Matsuda et al., "2015 Symposium on VLSI Technology Digest of Technical Papers", 2015, p.T216-T217 [Non-Patent Document 8] S. Amano et al., "SID Symposium Digest of Technical Papers", 2010, volume 41, issue 1, p.626-629

SUMMARY OF THE INVENTION

Problems to be Solved by the Invention

For charging a power storage device, a method in which a current is applied across a positive electrode and a negative electrode of the power storage device until the voltage between the positive electrode and the negative electrode becomes a certain value is often employed. The optimal current value for charging a power storage device depends on the constituent materials of the positive electrode, the negative electrode, and the electrolyte solution. In addition, the current value needs to be set properly in accordance with the ambient temperature at the time of charging (including heat generated by the power storage device) in order to reduce deterioration of the power storage device (e.g., decrease in power storage capacity).

An object of one embodiment of the present invention is to provide a semiconductor device capable of charging that is less likely to cause deterioration of a power storage device. Another object is to provide a charging method that is less likely to cause deterioration of a power storage device. Another object is to provide a charging method that is less likely to damage a power storage device. Another object is to provide a novel semiconductor device. Another object is to provide a novel charging device. Another object is to provide a novel charging method.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

The amount of a charging current is adjusted in accordance with the ambient temperature. Charging under low-temperature environments is performed with a reduced charging current. When the ambient temperature is too low or too high, charging is stopped. Measurement of the ambient temperature is performed with a memory element using an oxide semiconductor. The use of a memory element using an oxide semiconductor enables measurement of the ambient temperature and retention of the temperature information to be performed at the same time.

One embodiment of the present invention is a semiconductor device including a first memory element, a second memory element, a comparison circuit, and a current adjustment circuit. The first memory element has a function of retaining reference temperature information. The second memory element includes a transistor including an oxide semiconductor in a first semiconductor layer. The second memory element has a function of measuring ambient temperature, and a function of retaining the ambient temperature as ambient temperature information. The comparison circuit has a function of determining an operation of the current adjustment circuit by comparing the reference temperature information and the ambient temperature information. The current adjustment circuit has a function of supplying a current to a secondary battery.

A plurality of first memory elements may be provided. It is preferable that each of the first memory elements retain reference temperature information different from each other.

It is preferable that the semiconductor layer contain at least one of indium and zinc. It is more preferable that the semiconductor layer contain each of indium and zinc.

A lithium-ion secondary battery can be used as a secondary battery, for example.

Effect of the Invention

According to one embodiment of the present invention, a semiconductor device capable of charging that is less likely to cause deterioration of a power storage device can be provided. A charging method that is less likely to cause deterioration of a power storage device can also be provided. A charging method that is less likely to damage a power storage device can also be provided. A novel semiconductor device can also be provided. A novel charging device can also be provided. A novel charging method can also be provided.

Note that the description of these effects does not preclude the existence of other effects. Note that one embodiment of the present invention does not have to have all these effects.

Effects other than these are apparent from and can be derived from the description of the specification, the drawings, the claims, and the like.

BRIEF DESCRIPTION OF THE DRAWINGS

FIG. 16 Diagrams showing examples of an electronic device.

MODE FOR CARRYING OUT THE INVENTION

Embodiments of the present invention will be described in detail with reference to the drawings. Note that the present invention is not limited to the following description, and it will be readily understood by those skilled in the art that modes and details of the present invention can be modified in various ways. In addition, the present invention should not be construed as being limited to the description of embodiments below.

Note that in each drawing described in this specification, the size, the layer thickness, the region, and the like of each component are exaggerated or omitted for clarification of the invention in some cases. Thus, they are not limited to the shown scale.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims or the like in order to avoid confusion among components.

Embodiment 1

Figure 1:
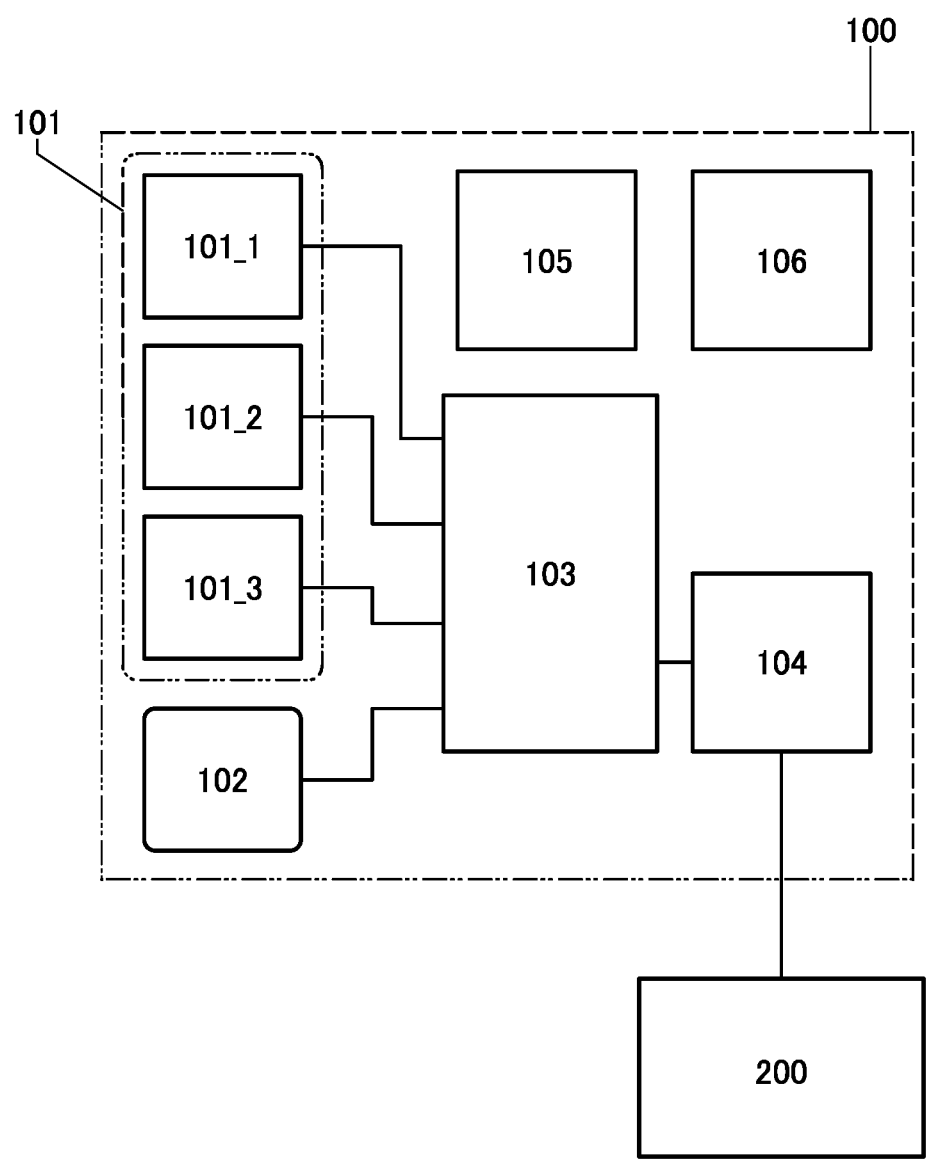
FIG. 1 A diagram for illustrating a semiconductor device.

A structure example and an operation example of a semiconductor device 100 of one embodiment of the present invention will be described with reference to drawings. FIG. 1 is a block diagram for illustrating a semiconductor device 100.

Structure Example

The semiconductor device 100 includes a memory element 101, a memory element 102, a comparison circuit 103, a current adjustment circuit 104, a control circuit 105, and an input/output circuit 106. The semiconductor device 100 is electrically connected to a secondary battery 200 and has a function of charging the secondary battery 200.

[Memory Element 101]

The memory element 101 includes one or more memory elements. In this embodiment, a case where the memory element 101 includes three memory elements (a memory element 101_1, a memory element 101_2, and a memory element 101_3) is shown.

Information (potential or charge) for changing a charging current in accordance with the ambient temperature at the time of charging is retained in the memory element 101. In this embodiment, information that corresponds to the temperature serving as a judgment criterion (also referred to as "reference temperature information") is retained in each of the memory element 101_1, the memory element 101_2, and the memory element 101_3.

Examples of a circuit configuration that can be used for the memory element 101 are shown in FIGS. 2(A) to 2(G). FIGS. 2(A) to 2(G) each function as a memory element. A memory element 410 shown in FIG. 2(A) includes a transistor M1 and a capacitor CA. The memory element 410 is a memory element including one transistor and one capacitor.

A first terminal of the transistor M1 is connected to a first terminal of the capacitor CA. A second terminal of the transistor M1 is connected to a wiring BL. A gate of the transistor M1 is connected to a wiring WL. A back gate of the transistor M1 is connected to a wiring BGL. A second terminal of the capacitor CA is connected to a wiring CAL. A node to which the first terminal of the transistor M1 and the first terminal of the capacitor CA are electrically connected is referred to as a node ND.

In an actual transistor, the gate and the back gate are provided to overlap with each other with a channel formation region of a semiconductor layer therebetween. The gate and the back gate can each function as a gate. Thus, when one of them is referred to as a "back gate", the other is referred to as a "gate" or a "front gate" in some cases. In some other cases, one of them is referred to as a "first gate" and the other is referred to as a "second gate".

The potential of the back gate may be the same as the potential of the gate, or may be a ground potential or a given potential. By changing the potential of the back gate independently of that of the gate, the threshold voltage of the transistor can be changed.

Providing the back gate and setting the potentials of the gate and the back gate electrode to be the same, a region of the semiconductor layer through which carriers flow is enlarged in the film thickness direction; thus, the amount of carrier transfer is increased. As a result, the on-state current of the transistor is increased and the field-effect mobility is increased.

Thus, the transistor can be a transistor having high on-state current for its occupation area. That is, the occupation area of the transistor can be small for required on-state current. Accordingly, a semiconductor device having a high degree of integration can be provided.

The wiring BGL functions as a wiring for applying a potential to the back gate of the transistor M1. By applying a given potential to the wiring BGL, the threshold voltage of the transistor M1 can be increased or decreased.

Data write and read are performed in such a manner that a high-level potential is applied to the wiring WL to turn on the transistor M1 so that the wiring BL is electrically connected to the node ND.

The wiring CAL functions as a wiring for applying a predetermined potential to the second terminal of the capacitor CA. A fixed potential is preferably applied to the wiring CAL.

Figure 2A:
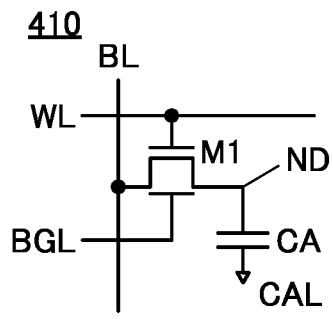
FIG. 2 Diagrams for illustrating circuit configuration examples of a memory element.
Figure 2B:
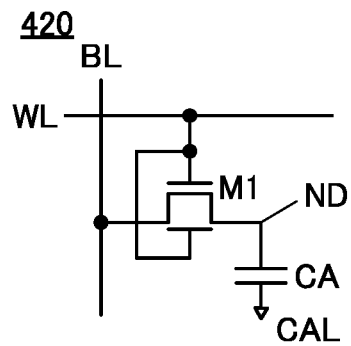

A memory element 420 shown in FIG. 2(B) is a modification example of the memory element 410. In the memory element 420, the back gate of the transistor M1 is electrically connected to the wiring WL. With such a configuration, a potential which is the same as that of the gate of the transistor M1 can be applied to the back gate of the transistor M1. Thus, the amount of current flowing through the transistor M1 can be increased when the transistor M1 is on.

Figure 2C:
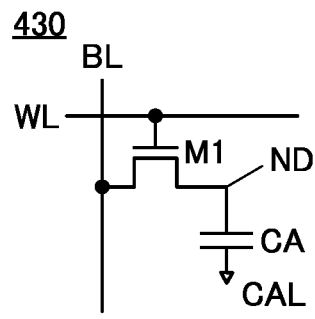

As in a memory element 430 shown in FIG. 2(C), the transistor M1 may be a single-gate transistor (a transistor without a back gate). The memory element 430 has a configuration of the memory element 410 and the memory element 420 from which the back gate of the transistor M1 is eliminated. Thus, the number of fabrication steps of the memory element 430 can be smaller than those of the memory element 410 and the memory element 420.

The memory element 410, the memory element 420, and the memory element 430 are each a DRAM-type memory element.

An oxide semiconductor, which is a metal oxide, is preferably used for a semiconductor layer in which a channel of the transistor M1 is formed. In this specification and the like, a transistor including an oxide semiconductor in a semiconductor layer where a channel is formed is also referred to as an "OS transistor".

A metal oxide containing any one of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used, for example, as an oxide semiconductor. An oxide semiconductor is preferably a metal oxide containing indium, gallium, and zinc, in particular.

An OS transistor has a characteristic of an extremely small off-state current. When an OS transistor is used as the transistor M1, the leakage current of the transistor M1 can be extremely low. That is, written data can be retained for a long time with the transistor M1. Thus, the frequency of refresh of the memory element can be reduced. In addition, refresh operation of the memory element can be omitted. Furthermore, since the leakage current is extremely low, multilevel data or analog data can be retained in the memory element 410, the memory element 420, and the memory element 430.

In this specification and the like, DRAM using an OS transistor is referred to as DOSRAM (dynamic oxide semiconductor random access memory).

Figure 2D:
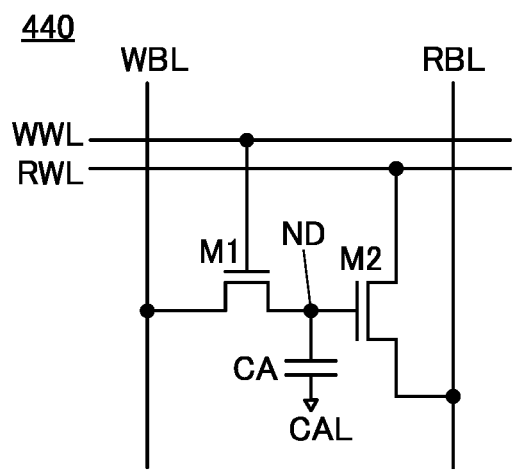

FIG. 2(D) shows a circuit configuration example of a gain-cell memory element made up of two transistors and one capacitor. A memory element 440 includes a transistor M1, a transistor M2, and a capacitor CA.

A first terminal of the transistor M1 is connected to a first terminal of the capacitor CA, a second terminal of the transistor M1 is connected to a wiring WBL, and a gate of the transistor M1 is connected to a wiring WWL. A second terminal of the capacitor CA is connected to a wiring CAL. A first terminal of the transistor M2 is connected to a wiring RBL, a second terminal of the transistor M2 is connected to a wiring RWL, and a gate of the transistor M2 is connected to the first terminal of the capacitor CA. A node to which the first terminal of the transistor M1, the first terminal of the capacitor CA, and the gate of the transistor M2 are electrically connected is referred to as a node ND.

The bit line WBL functions as a write bit line, the bit line RBL functions as a read bit line, the word line WWL functions as a write word line, and the word line RWL functions as a read word line. The transistor M1 has a function of a switch for controlling conduction or non-conduction between the node ND and the bit line WBL.

It is preferable to use an OS transistor as the transistor M1. As described above, since the OS transistor has extremely small off-state current, a potential written to the node ND can be retained for a long time when the OS transistor is used as the transistor M1. In other words, data written in the memory element can be retained for a long time.

A transistor to be used as the transistor M2 is not particularly limited. Any of an OS transistor, a Si transistor (a transistor in which silicon is used for the semiconductor layer), or other transistors may be used as the transistor M2.

Note that in the case where a Si transistor is used as the transistor M2, silicon used for the semiconductor layer may be amorphous silicon, polycrystalline silicon, low-temperature polysilicon (LTPS), or single crystal silicon. Since a Si transistor has higher field-effect mobility than an OS transistor in some cases, the use of the Si transistor as a read transistor can improve the operation speed at the time of read.

In the case where an OS transistor is used as the transistor M1 and a Si transistor is used as the transistor M2, the two transistors may be provided in different layers to be stacked on one another. An OS transistor can be fabricated with the same manufacturing equipment by the same process as those of a Si transistor. Thus, hybridization of an OS transistor and a Si transistor is easy, and higher integration is also easy.

Furthermore, when an OS transistor is used as the transistor M2, its leakage current when being non-selected can be extremely small; thus, reading accuracy can be improved. When an OS transistor is used for each of the transistor M1 and the transistor M2, the number of fabrication steps of the semiconductor device can be reduced and the productivity can be improved. It is possible to fabricate the semiconductor device at a process temperature of 400° C. or lower, for example.

Figure 2E:
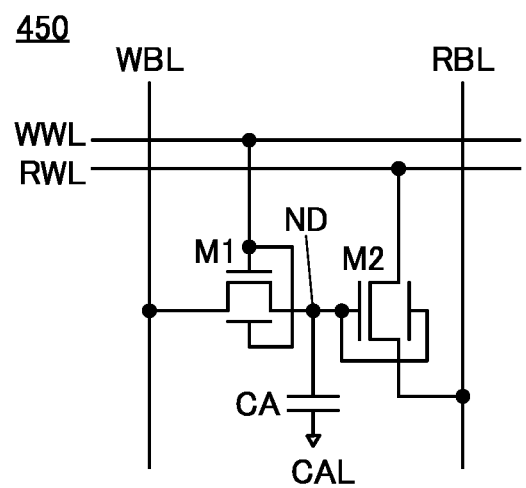
Figure 2F:
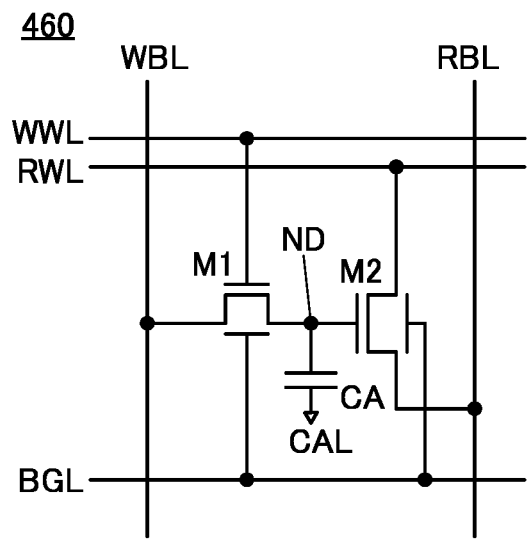
Figure 2G:
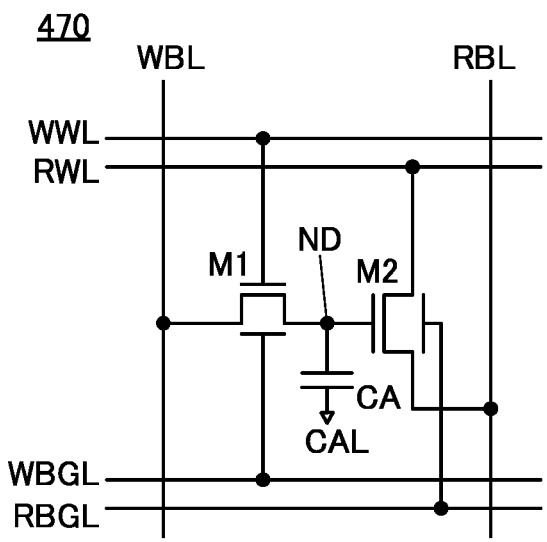

Circuit configuration examples of a case where a transistor having a back gate (four-terminal transistor, also referred to as a "four-terminal element") is used as each of the transistor M1 and the transistor M2 are shown in FIGS. 2(E) to 2(G). A memory element 450 shown in FIG. 2(E), a memory element 460 shown in FIG. 2(F), and a memory element 470 shown in FIG. 2(G) are modification examples of the memory element 440.

In the memory element 450 shown in FIG. 2(E), the gate and the back gate of the transistor M1 are electrically connected to each other. In addition, the gate and the back gate of the transistor M2 are electrically connected to each other.

In the memory element 460 shown in FIG. 2(F), the back gate of the transistor M1 and the back gate of the transistor M2 are electrically connected to the wiring BGL. A predetermined potential can be applied to the back gates of the transistor M1 and the transistor M2 through the wiring BGL.

In the memory element 470 shown in FIG. 2(G), the back gate of the transistor M1 is electrically connected to a wiring WBGL, and the back gate of the transistor M2 is electrically connected to a wiring RBGL. When the back gate of the transistor M1 and the back gate of the transistor M2 are connected to different wirings, the threshold voltages can be changed independently from each other.

The memory element 440 to the memory element 470 are each a 2Tr1C-type memory cell. In this specification and the like, a memory device constituting a 2Tr1C-type memory cell using an OS transistor as the transistor M1 is referred to as a NOSRAM (Non-volatile Oxide Semiconductor Random Access Memory). The memory element 440 to the memory element 470 are capable of reading the potential of the node ND by amplifying the potential with the transistor M12. Since the off-state current of an OS transistor is extremely small, the potential of the node ND can be retained for a long time. In addition, non-destructive read is possible, with which the potential of the node ND remains retained even after the read operation.

Data retained in the memory element 101 is data with less rewrite frequency. Thus, it is preferable to use as the memory element 101 a NOSRAM, which is capable of non-destructive read and long-term retention of data.

The transistors shown in FIGS. 2(A), 2(B), and 2(E) to 2(G) are each a four-terminal element; hence, its input and output can be controlled independently of each other in a simpler manner than that in two-terminal elements typified by MRAM (Magnetoresistive Random Access Memory) utilizing MTJ (Magnetic Tunnel Junction) properties, ReRAM (Resistive Random Access Memory), and phase-change memory.

In addition, the structure of MRAM, ReRAM, and phase-change memory may change at the atomic level when data is rewritten. By contrast, in the memory device of one embodiment of the present invention, data rewrite is performed by charging or discharging of electric charge via transistors; thus, the memory device has characteristics such as high rewrite endurance and less structure changes.

[Memory Element 102]

A memory element similar to the memory element 101 can be used as the memory element 102. It is preferable to use DOSRAM or NOARAM as the memory element 102.

Figure 3A:
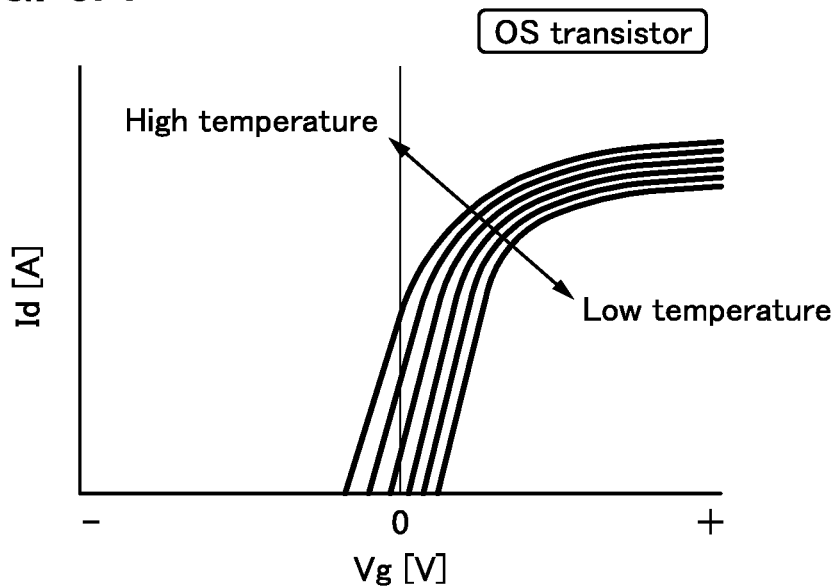
FIG. 3 Diagrams for illustrating electrical characteristics of transistors.
Figure 3B:
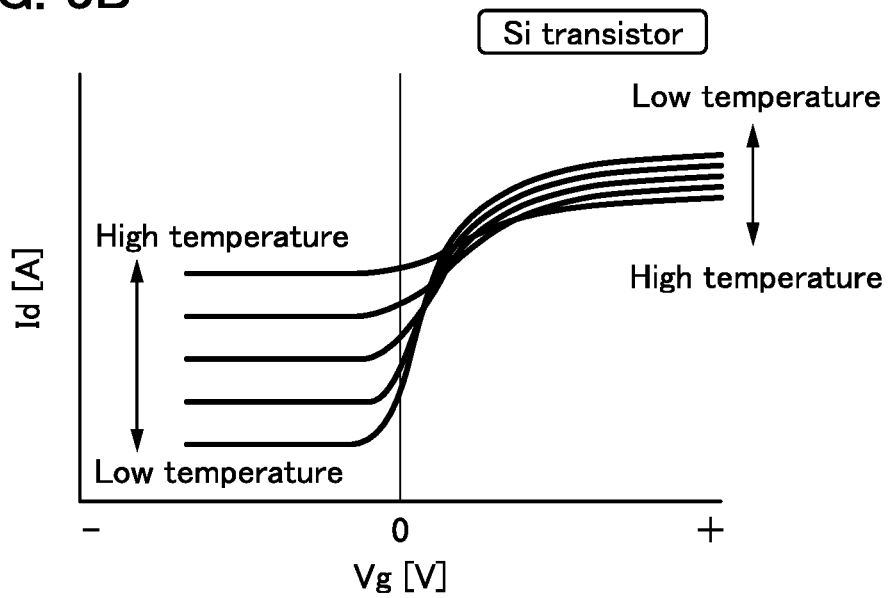

Here, temperature dependence of Id-Vg characteristics, which is one of the electrical characteristics of a transistor, is described. FIG. 3(A) and FIG. 3(B) show an example of Id-Vg characteristics, which are electrical characteristics of a transistor. The Id-Vg characteristics show a change in drain current (Id) with respect to a change in gate voltage (Vg). The horizontal axis in FIG. 3(A) and FIG. 3(B) represents Vg on a linear scale. The vertical axis in FIG. 3(A) and FIG. 3(B) represents Id on a log scale.

FIG. 3(A) shows the Id-Vg characteristics of an OS transistor. FIG. 3(B) shows the Id-Vg characteristics of a transistor using silicon for a semiconductor layer in which a channel is formed (Si transistor). Note that both FIG. 3(A) and FIG. 3(B) show the Id-Vg characteristics of an n-channel transistor.

As shown in FIG. 3(A), the off-state current is less likely to increase in the OS transistor even in the operation at high temperature environments. An OS transistor can achieve an on/off ratio of 10 digits or larger even when the operating temperature is 125° C. to 150° C. inclusive. By contrast, in the Si transistor, the off-state current increases with the increase in temperature as shown in FIG. 3(B). Moreover, in the Si transistor, Vth shifts in the positive direction with the increase in temperature, and the on-state current decreases.

The use of the OS transistor as the transistor M1 enables a long-term data retention even at the time of operation under high temperatures.

An oxide semiconductor tends to decrease in resistance in nature when the temperature rises. By utilizing this nature, it is possible to convert the ambient temperature into potential. In the case where the memory element 430 shown in FIG. 2(C) is used, for example, the transistor M1 is turned on first to supply 0V to the wiring BL and 0V is written to the node ND. Next, VDD is supplied to the wiring BL and the transistor M1 is turned off after a certain period. An oxide semiconductor changes in resistance depending on the temperature. Thus, potential that corresponds to the ambient temperature at the time of measurement (also referred to as "ambient temperature information") is retained at the node ND. As the ambient temperature rises, the potential retained at the node ND becomes higher.

In the above-described manner, the memory element 102 can function as a temperature sensor. The use of an oxide semiconductor enables the memory element 101 and the memory element 102 to be fabricated through the same steps at the same time. Furthermore, since the provision of a temperature sensor such as a thermistor is not required, the productivity of the semiconductor device 100 can be improved.

[Comparison Circuit 103]

The comparison circuit 103 has a function of determining the operation of a current adjustment circuit by comparing the temperature information retained in the memory element 101 and the ambient temperature retained in the memory element 102. Specifically, the comparison circuit 103 compares the potential of the node ND of the memory element 101 and the potential of the node ND of the memory element 102. The comparison circuit 103 can be composed of a comparator or the like.

[Current Adjustment Circuit 104]

The current adjustment circuit 104 has a function of controlling a current value to be supplied to the secondary battery 200 by a signal supplied from the comparison circuit 103. The current adjustment circuit 104 can be composed of a power transistor or the like.

[Control Circuit 105, Input/Output Circuit 106]

The control circuit 105 has a function of collectively controlling operations of the memory element 101, the memory element 102, the comparison circuit 103, the current adjustment circuit 104, and the input/output circuit 106. In addition, control signals, setting information of the memory element 101, and the like are supplied through the input/output circuit 106 to the control circuit 105 from external circuits. The control circuit 105 also has a function of outputting the charging voltage of the secondary battery 200, the current value output from the current adjustment circuit 104, the ambient temperature information obtained by the memory element 102, and the like through the input/output circuit 106 to the external circuits.

Operation Example

Next, an example of a charging operation of the secondary battery 200 using the semiconductor device 100 will be explained.

[Charging Method]

The secondary battery can be charged in the following manner, for example.

[Cc Charging]

Figure 4A:
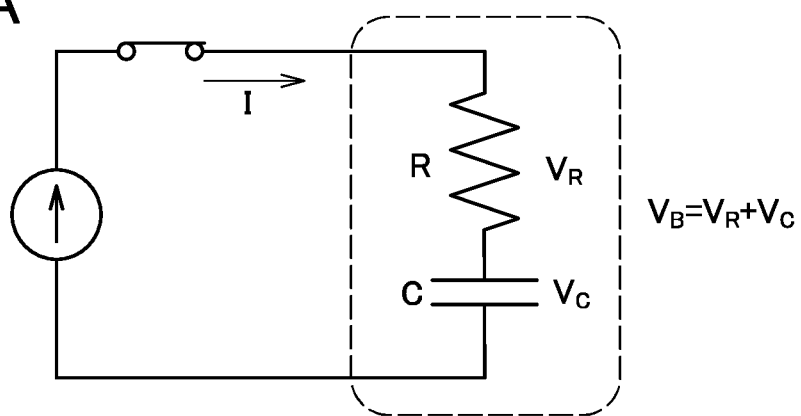
FIG. 4 Diagrams for illustrating a charging method for a secondary battery.

First, CC charging is described as one of charging methods. CC charging is a charging method in which a constant current is made to flow to a secondary battery in the whole charging period and charging is terminated when the voltage reaches a predetermined voltage. The secondary battery is assumed to be an equivalent circuit with internal resistance R and secondary battery capacitance C as shown in FIG. 4(A). In that case, secondary battery voltage $V_B$ is the sum of voltage $V_R$ applied to the internal resistance R and voltage $V_C$ applied to the secondary battery capacitance C.

While the CC charging is performed, a switch is on as shown in FIG. 4(A), so that a constant current I flows to the secondary battery. During the period, the current I is constant; thus, in accordance with the Ohm's law, $V_R$=R×I, the voltage $V_R$ applied to the internal resistance R is also constant. By contrast, the voltage $V_C$ applied to the secondary battery capacitance C increases over time. Accordingly, the secondary battery voltage $V_B$ increases over time.

Figure 4B:
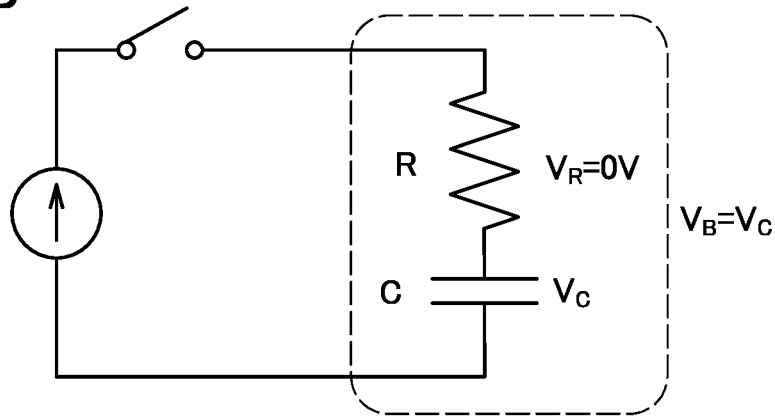

When the secondary battery voltage $V_B$ reaches a predetermined voltage, e.g., 4.3 V, the charging is terminated. On termination of the CC charging, the switch is turned off as shown in FIG. 4(B), and the current I becomes 0. Thus, the voltage $V_R$ applied to the internal resistance R becomes 0 V. Consequently, the secondary battery voltage $V_B$ is decreased.

Figure 4C:
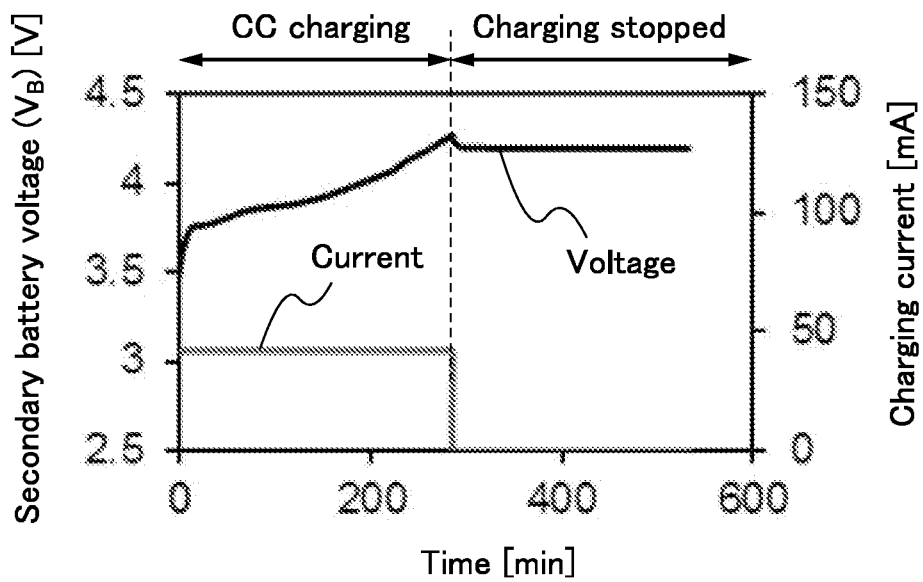

FIG. 4(C) shows examples of the secondary battery voltage $V_B$ and charging current while the CC charging is performed and after the CC charging is stopped. As shown in FIG. 4(C), the secondary battery voltage $V_B$ increases while the CC charging is performed, and slightly decreases after the CC charging is terminated.

[Cccv Charging]

Next, CCCV charging, which is a charging method different from the above-described method, is described. CCCV charging is a charging method in which CC charging is performed until the voltage reaches a predetermined voltage and then constant voltage (CV) charging is performed until the amount of current flow becomes small, specifically, reaches a termination current value.

Figure 5A:
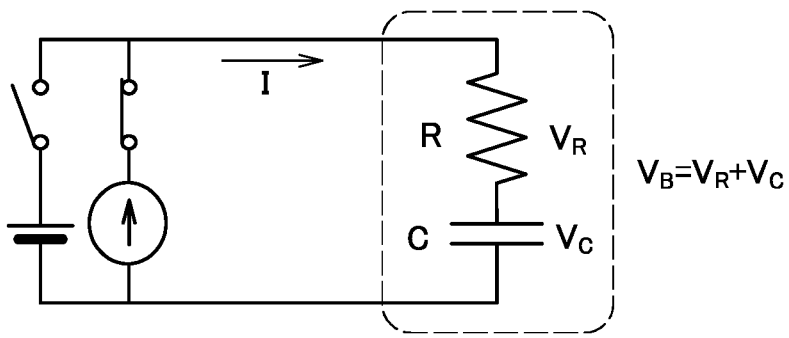
FIG. 5 Diagrams for illustrating a charging method for a secondary battery.

While the CC charging is performed, a switch of a constant current power source is on and a switch of a constant voltage power source is off as shown in FIG. 5(A), so that the constant current I flows to the secondary battery. During the period, the current I is constant; thus, in accordance with the Ohm's law, $V_R$=R×I, the voltage $V_R$ applied to the internal resistance R is also constant. By contrast, the voltage $V_C$ applied to the secondary battery capacitance C increases over time. Accordingly, the secondary battery voltage $V_B$ increases over time.

Figure 5B:
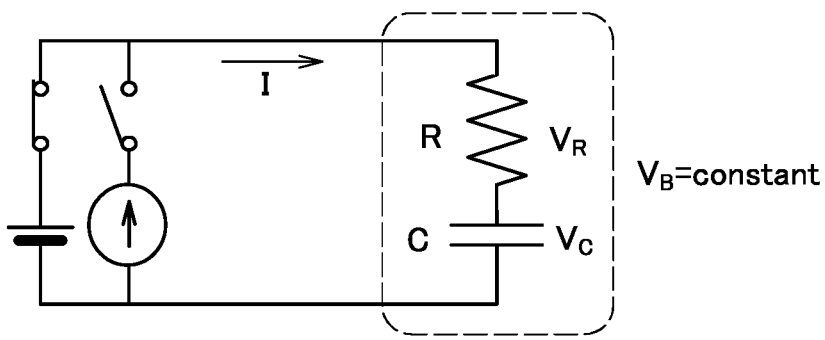

When the secondary battery voltage $V_B$ reaches a predetermined voltage, e.g., 4.3 V, the CC charging is switched to the CV charging. While the CV charging is performed, the switch of the constant voltage power source is on and the switch of the constant current power source is off as shown in FIG. 5(B); thus, the secondary battery voltage $V_B$ is constant. By contrast, the voltage $V_C$ applied to the secondary battery capacitance C increases over time. Since $V_B$=$V_R$ $V_C$ is satisfied, the voltage $V_R$ applied to the internal resistance R decreases over time. As the voltage $V_R$ applied to the internal resistance R decreases, the current/flowing to the secondary battery also decreases in accordance with the Ohm's law, $V_R$=R×I.

Figure 5C:
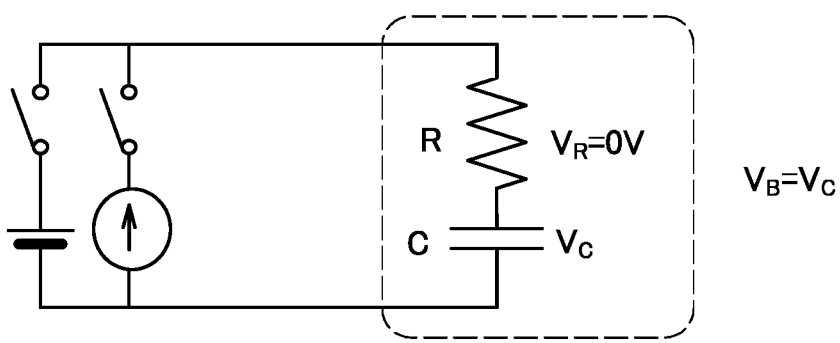

When the current I flowing to the secondary battery becomes a predetermined current, e.g., approximately 0.01 C, charging is terminated. On termination of the CCCV charging, all the switches are turned off as shown in FIG. 5(C), so that the current I becomes 0. Thus, the voltage $V_R$ applied to the internal resistance R becomes 0 V. However, the voltage $V_R$ applied to the internal resistance R becomes sufficiently small by the CV charging; thus, even when a voltage drop no longer occurs in the internal resistance R, the secondary battery voltage $V_B$ hardly decreases.

Figure 5D:
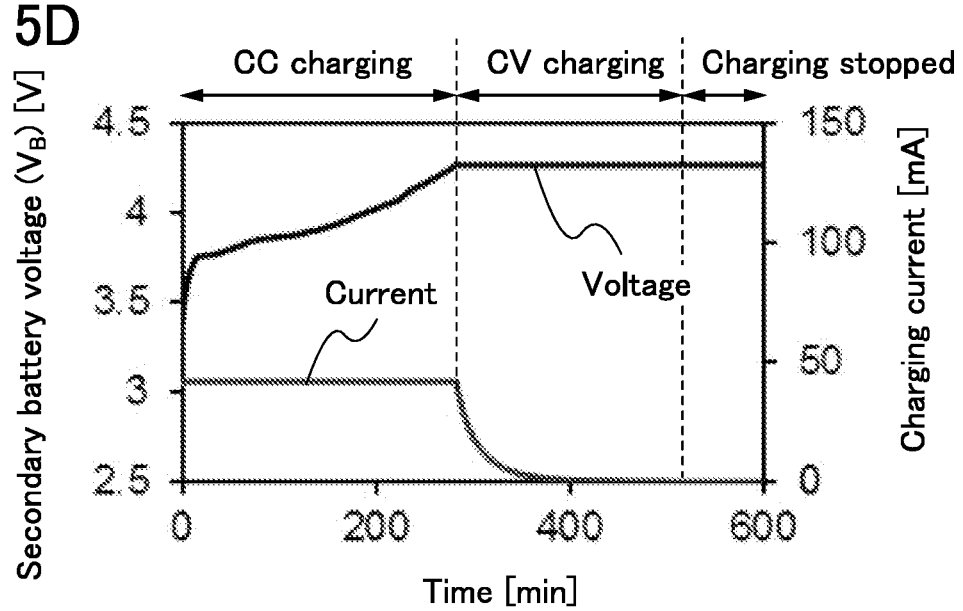

FIG. 5(D) shows an example of the secondary battery voltage $V_B$ and charging current while the CCCV charging is performed and after the CCCV charging is terminated. As shown in FIG. 5(D), the secondary battery voltage $V_B$ hardly decreases even after the CCCV charging is terminated.

[Charging Rate]

Here, a charging rate is described. The charging rate refers to the relative ratio of charging current to battery capacity, and is expressed in a unit C. A current corresponding to 1 C in a battery with a rated capacity X [Ah] is X [A]. In the case where a battery is charged with a current of 2X [A], the battery is charged at 2 C, and in the case where a battery is charged with a current of X/5 [A], the battery is charged at 0.2 C.

Example of Charging Operation

In general, a charging condition of a secondary battery depends on the constituent materials of a positive electrode, a negative electrode, and an electrolyte solution included in the secondary battery. In this embodiment, an example in which the semiconductor device 100 performs CC charging with respect to the secondary battery 200 under the charging conditions shown in Table 1 will be described.

TABLE 1

| | |
|---|---|
| Battery capacity | 3000 mAh |
| Maximum charging voltage | 4.3 V |
| Temperature enabling charging | 0-45° C. |
| Charging rate (10-45° C.) | 0.5 C. |
| Charging rate (<10° C.) | 0.25 C. |

Figure 6:
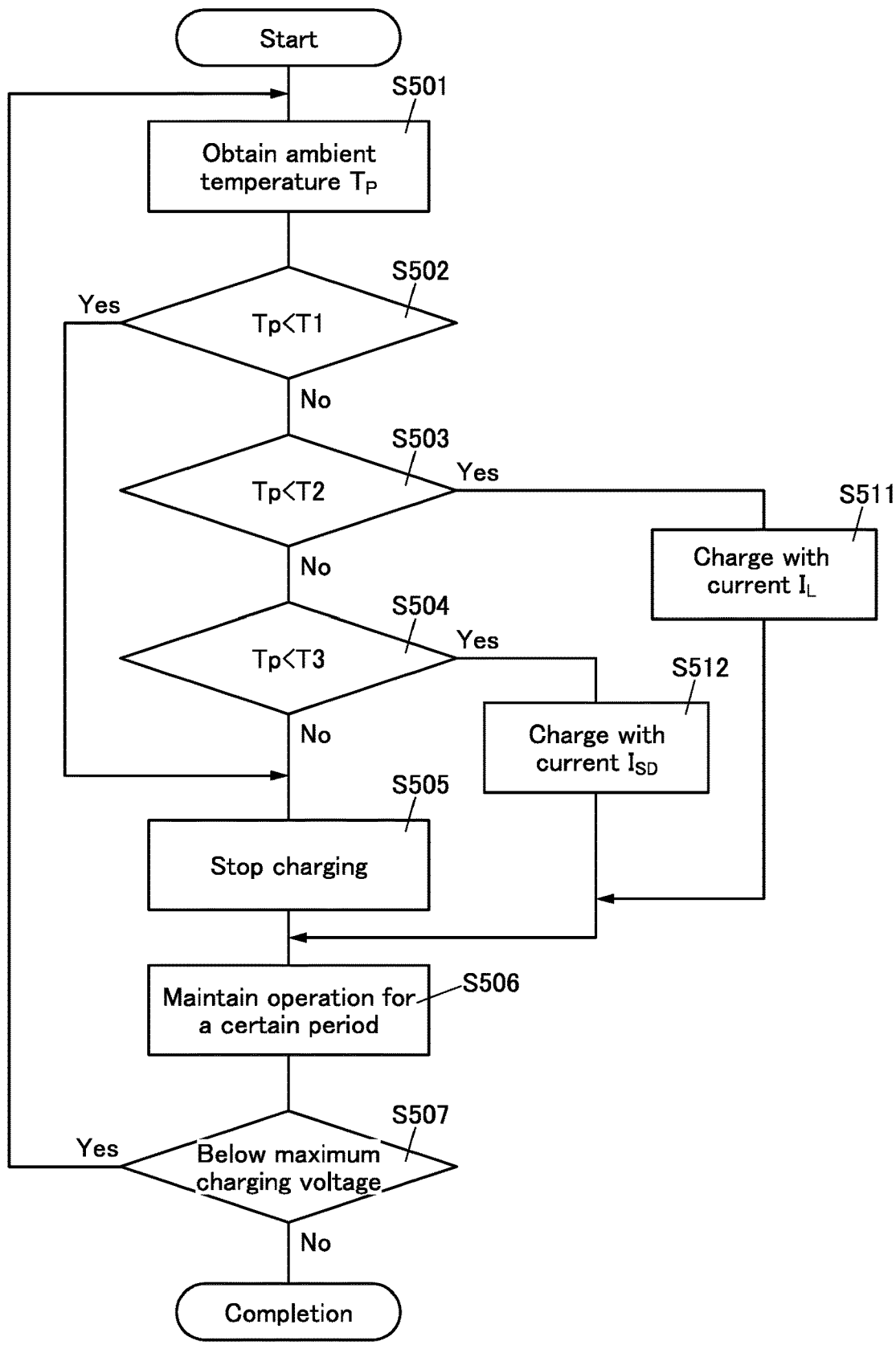
FIG. 6 A flow chart for illustrating a charging operation of a semiconductor device.
Figure 7A:
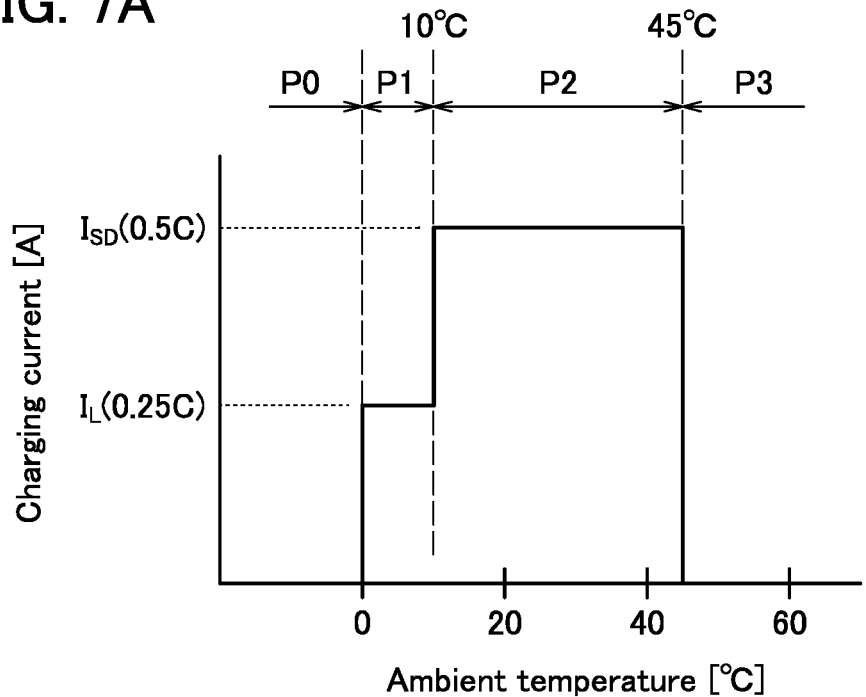
FIG. 7 Diagrams for illustrating the relation between ambient temperatures and charging currents.

FIG. 6 is a flow chart describing the charging operation of the semiconductor device 100. FIG. 7(A) is a graph showing the relation between ambient temperatures and charging currents. FIG. 7(A) shows a temperature region P0 which covers temperatures lower than 0° C., a temperature region P1 which covers temperatures higher than or equal to 0° C. and lower than 10° C., a temperature region P2 which covers temperatures higher than or equal to 10° C. and lower than 45° C., and a temperature region P3 which covers temperatures higher than or equal to 45° C.

First, an ambient temperature Tp is obtained (Step S501).

Next, a temperature condition T1 retained in the memory element 101_1 and the ambient temperature Tp are compared (Step S502). In the case where the ambient temperature Tp is lower than the temperature condition T1, it is determined that the secondary battery 200 is in the temperature region P0, and charging of the secondary battery 200 is stopped (supply of the current is stopped) (Step S505).

In the case where the ambient temperature Tp is higher than the temperature condition T1, the ambient temperature Tp is compared with a temperature condition T2 retained in the memory element 101_2 (Step S503). In the case where the ambient temperature Tp is lower than the temperature condition T2, it is determined that the secondary battery 200 is in the temperature region P1, and a current $I_L$ is supplied to the secondary battery 200 (Step S511). In this embodiment, the current $I_L$ is a current corresponding to a charging rate of 0.25 C. Thus, the current $I_L$ is 750 mA.

In the case where the ambient temperature Tp is higher than the temperature condition T2, the ambient temperature Tp is compared with a temperature condition T3 retained in the memory element 101_3 (Step S504). In the case where the ambient temperature Tp is lower than the temperature condition T3, it is determined that the secondary battery 200 is in the temperature region P2, and a current $I_{SD}$ is supplied to the secondary battery 200 (Step S512). In this embodiment, the current $I_{SD}$ is a current corresponding to a charging rate of 0.5 C. Thus, the current ISD is 1500 mA.

In the case where the ambient temperature Tp is higher than the temperature condition T3, it is determined that the secondary battery 200 is in the temperature region P3, and charging of the secondary battery 200 is stopped (supply of the current is stopped) (Step S505).

Then, the state of Step S505, Step S511, or Step S512 is maintained for a certain period (Step S506).

After the certain period, whether or not the voltage of the secondary battery 200 is lower than the maximum charging voltage is determined. In this embodiment, whether or not the voltage of the secondary battery 200 is lower than 4.3 V is determined. In the case where the voltage of the secondary battery 200 is lower than the maximum charging voltage, the operation returns to Step S501 (Step S507). In the case where the voltage of the secondary battery 200 is higher than or equal to the maximum charging voltage, the charging operation is terminated.

Note that for the CCCV charging, the CV charging is performed subsequently.

Under the condition where the ambient temperature is low (lower than 10° C. in this embodiment), the reaction rate of the negative electrode material and Li decreases, which facilitates Li deposition. Li deposition sometimes contributes to a decrease in battery capacity and a fire accident due to internal short-circuiting. Thus, the charging current is preferably small. In addition, in the case where the ambient temperature is too low (lower than 0° C. in this embodiment), supply of a charging current is stopped.

Charging under a condition where the ambient temperature is too high (higher than 45° C. in this embodiment) facilitates oxidation decomposition of the electrolyte solution and elution of a metal component from the positive electrode material, which sometimes contributes to decrease in battery capacity.

Adjusting the charging current in accordance with the ambient temperature prevents deterioration of the secondary battery and enables safer charging.

Figure 7B:
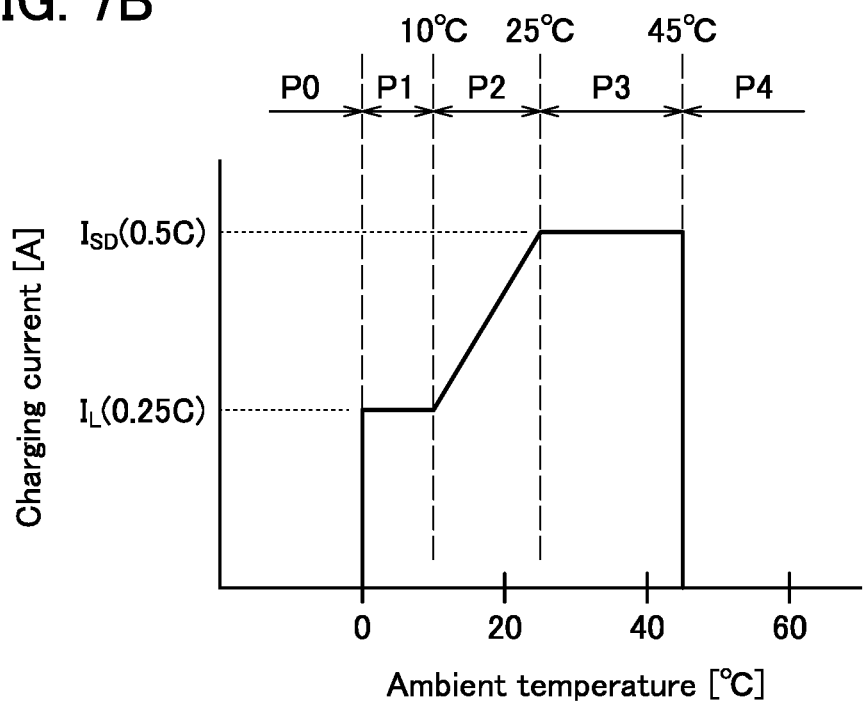

FIG. 7(B) shows a temperature region P0 which covers temperatures lower than 0° C., a temperature region P1 which covers temperatures higher than or equal to 0° C. and lower than 10° C., a temperature region P2 which covers temperatures higher than or equal to 10° C. and lower than 25° C., a temperature region P3 which covers temperatures higher than or equal to 25° C. and lower than 45° C., and a temperature region P4 which covers temperatures higher than or equal to 45° C.

As shown in FIG. 7(B), the ambient temperature and the charging current may be continuously changed in a specific temperature region. FIG. 7(B) shows an example in which the charging current is continuously changed in accordance with the ambient temperature in the temperature region P2. With such a control, the charging time of the secondary battery 200 can be shortened.

This embodiment can be implemented in combination with any of the structures described in the other embodiments and the like, as appropriate.

Embodiment 2

High current drive capability and/or high speed operation are required for the comparison circuit 103, the current adjustment circuit 104, the control circuit 105, and the input/output circuit 106 in some cases. In such cases, it is preferable to use Si transistors for the comparison circuit 103, the current adjustment circuit 104, the control circuit 105, and the input/output circuit 106.

As described in the above embodiment, it is preferable to use OS transistors for the memory element 101 and the memory element 102.

An OS transistor and a Si transistor can be stacked on one another. As the semiconductor device 100, an integrated circuit 160 including the memory element 101 and the memory element 102 may be provided over an integrated circuit 150 including the comparison circuit 103, the current adjustment circuit 104, the control circuit 105, and the input/output circuit 106, for example. Providing a variety of circuits to be stacked on one another can reduce the size of the semiconductor device 100. In other words, the area occupied by the semiconductor device 100 can be reduced.

Cross-Sectional Structure Example

Figure 8A:
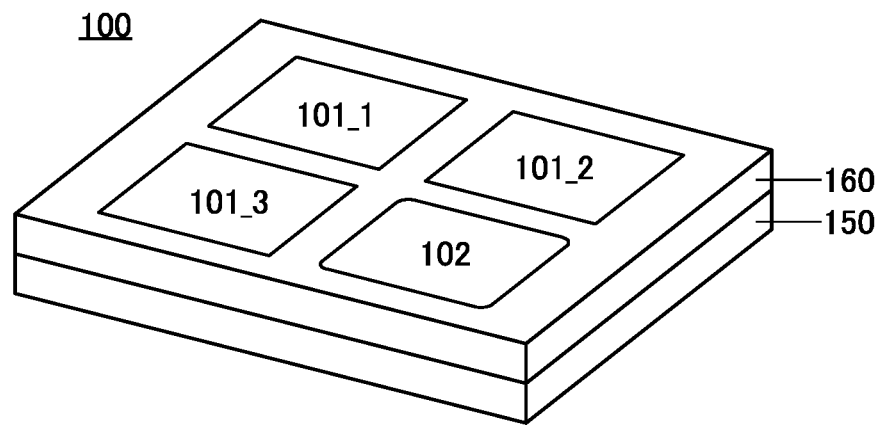
FIG. 8 Perspective views of a semiconductor device 100.
Figure 8B:
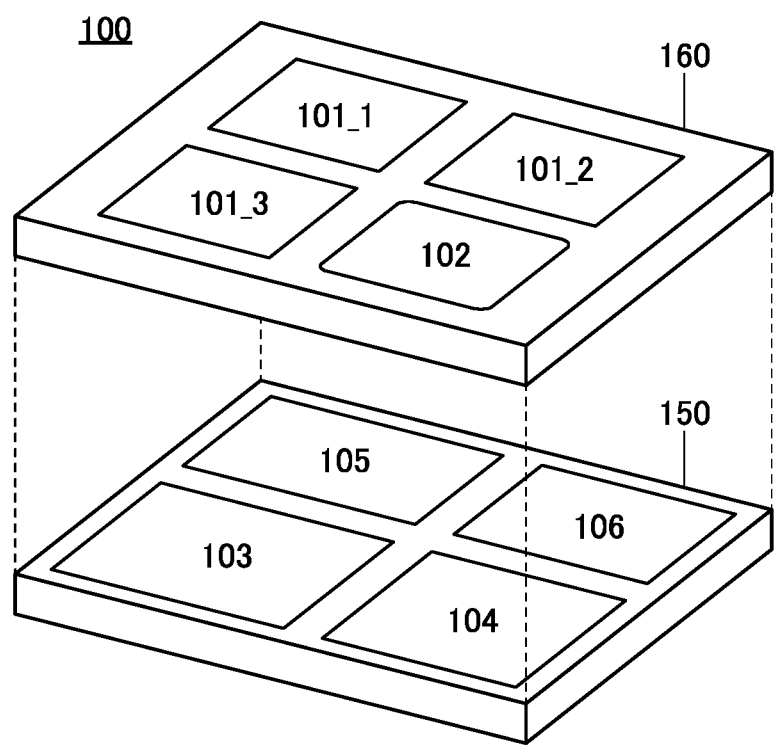
Figure 9:
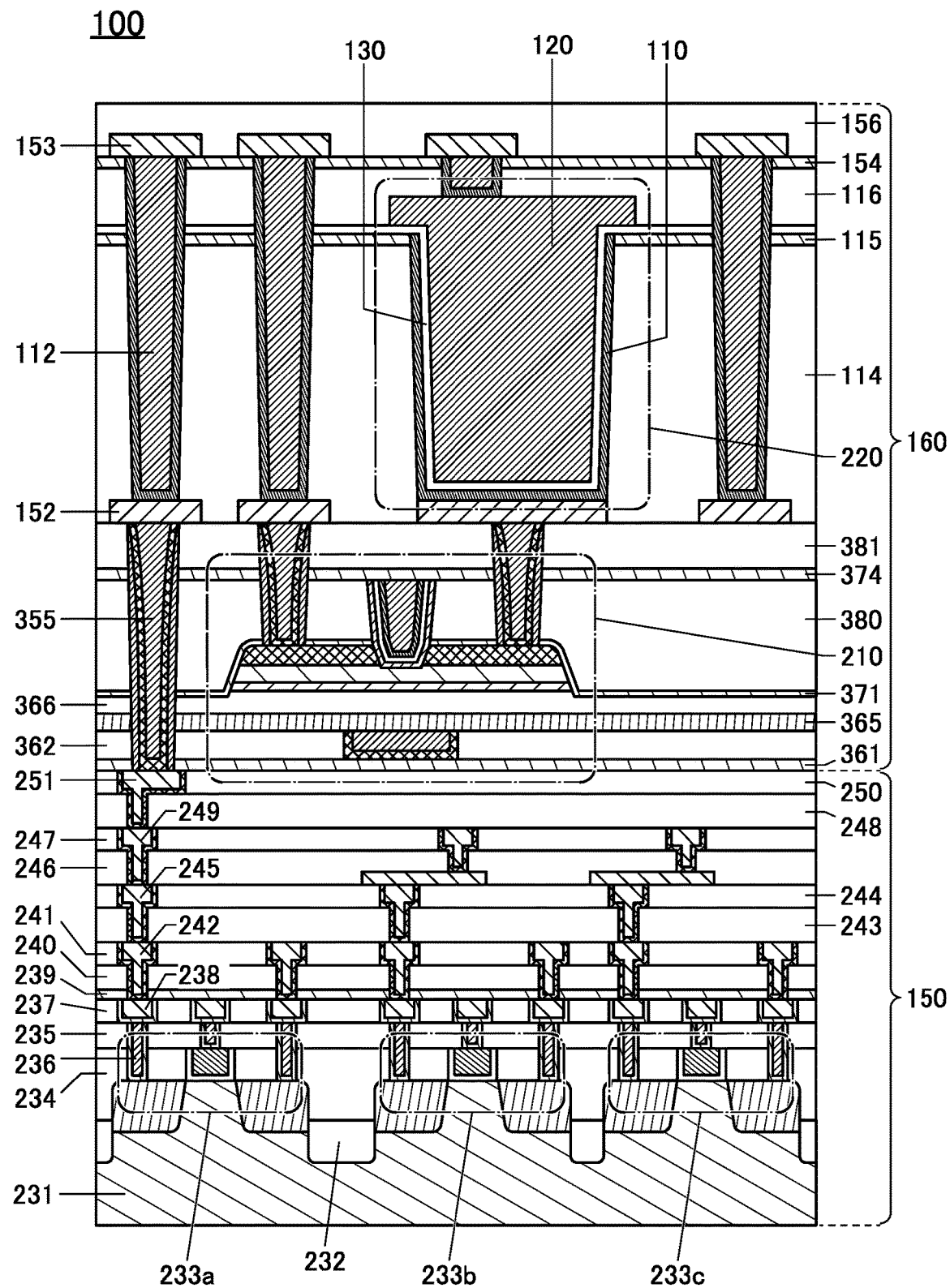
FIG. 9 A cross-sectional view of a semiconductor device 100.

FIG. 8(A) is a perspective view of the semiconductor device 100 including the integrated circuit 150 and the integrated circuit 160. FIG. 8(B) is a diagram for making it easier to understand the positional relation between the integrated circuit 150 and the integrated circuit 160. FIG. 9 is a cross-sectional view of a portion of the semiconductor device 100.

[Integrated Circuit 150]

In FIG. 9, the integrated circuit 150 includes a transistor 233a, a transistor 233b, and a transistor 233c over the substrate 231. FIG. 9 shows cross sections of the transistor 233a, the transistor 233b, and the transistor 233c in the channel length direction.

Channels of the transistor 233a, the transistor 233b, and the transistor 233c are formed in part of the substrate 231. When an integrated circuit is required to operate at high speed, a single crystal semiconductor substrate is preferably used as the substrate 231.

The transistor 233a, the transistor 233b, and the transistor 233c are electrically isolated from each other by an element isolation layer 232. For the formation of the element isolation layer, a LOCOS (Local Oxidation of Silicon) method, an STI (Shallow Trench Isolation) method, or the like can be used.

An insulating layer 234, an insulating layer 235, and an insulating layer 237 are provided over the transistor 233a, the transistor 233b, and the transistor 233c, and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Integrated Circuit 160]

The integrated circuit 160 is provided over the integrated circuit 150. In FIG. 9, the integrated circuit 160 includes a transistor 210 and a capacitor 220. FIG. 9 shows a cross section of the transistor 210 in the channel length direction. The transistor 210 is a transistor having a back gate.

An oxide semiconductor, which is one kind of metal oxide, is preferably used for a semiconductor layer of the transistor 210. In other words, it is preferable to use an OS transistor as the transistor 210.

The transistor 210 is provided over an insulating layer 361. An insulating layer 362 is provided over the insulating layer 361. A back gate of the transistor 210 is embedded in the insulating layer 362. An insulating layer 371 and an insulating layer 380 are provided over the insulating layer 362. A gate of the transistor 210 is embedded in the insulating layer 380.

An insulating layer 374 and an insulating layer 381 are provided over the insulating layer 380. An electrode 355 is embedded in the insulating layer 361, the insulating layer 362, an insulating layer 365, an insulating layer 366, the insulating layer 371, the insulating layer 380, the insulating layer 374, and the insulating layer 381. The electrode 355 is electrically connected to the electrode 251. The electrode 355 can function as a contact plug.

An electrode 152 is provided over the insulating layer 381. The electrode 152 is electrically connected to the electrode 355. An insulating layer 114, an insulating layer 115, and an insulating layer 130 are provided over the insulating layer 381 and the electrode 152.

The capacitor 220 includes an electrode 110 placed in an opening formed in the insulating layer 114 and the insulating layer 115, an insulating layer 130 over the electrode 110 and the insulating layer 115, and an electrode 120 over the insulating layer 130. In the opening formed in the insulating layer 114 and the insulating layer 115, at least part of the electrode 110, at least part of the insulating layer 130, and at least part of the electrode 120 are placed.

The electrode 110 functions as a lower electrode of the capacitor 220, the electrode 120 functions as an upper electrode of the capacitor 220, and the insulating layer 130 functions as a dielectric of the capacitor 220. In the capacitor 220, the upper electrode and the lower electrode face each other with the dielectric positioned therebetween on the side surface as well as the bottom surface of the opening in the insulating layer 114 and the insulating layer 115; thus, the capacitance per unit area can be increased. Accordingly, the deeper the opening is, the larger the capacitance of the capacitor 220 can be. Increasing the capacitance per unit area of the capacitor 220 in this manner can promote miniaturization or higher integration of a semiconductor device.

The shape of the opening formed in the insulating layer 114 and the insulating layer 115 when seen from above may be a quadrangular shape, a polygonal shape other than a quadrangular shape, a polygonal shape with rounded corners, or a circular shape including an elliptical shape. An insulating layer 116 and an insulating layer 154 are provided over the insulating layer 130 and the electrode 120. An electrode 112 is embedded in the insulating layer 114, the insulating layer 115, the insulating layer 130, the insulating layer 116, and the insulating layer 154. The electrode 112 is electrically connected to the electrode 152. The electrode 112 can function as a contact plug. An electrode 153 is provided over the insulating layer 154. The electrode 153 is electrically connected to the electrode 112.

An insulating layer 156 is provided over the insulating layer 154 and the electrode 153.

Modification Example 1

Figure 10:
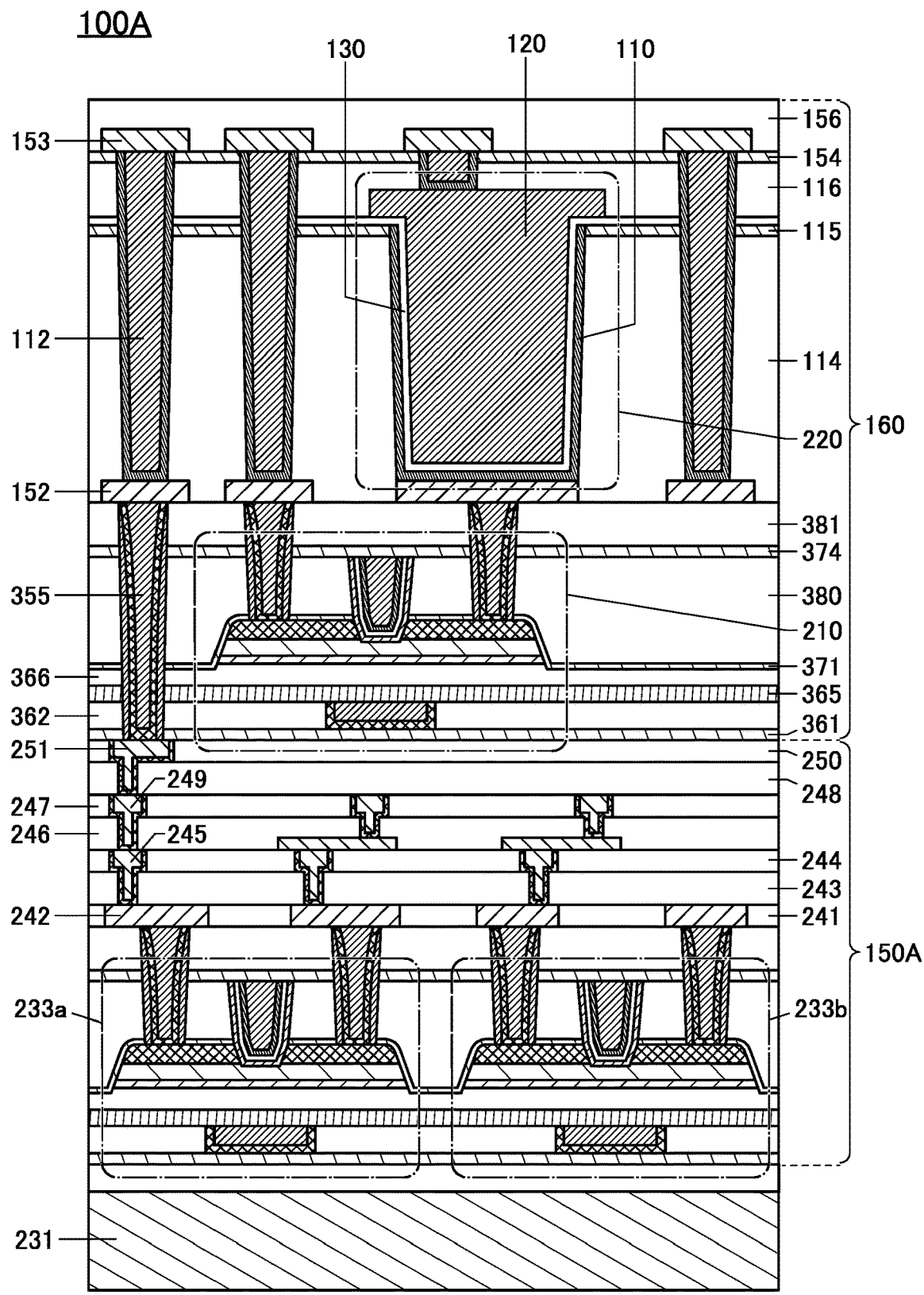
FIG. 10 A cross-sectional view of a semiconductor device 100A.

FIG. 10 shows a semiconductor device 100A, which is a modification example of the semiconductor device 100. In the semiconductor device 100A, an integrated circuit 150A and the integrated circuit 160 are provided to be stacked on one another. In the integrated circuit 150A, OS transistors are used as the transistors included in the integrated circuit 150 such as the transistor 233a and the transistor 233b. All the transistors included in the semiconductor device 100A are OS transistors, whereby the semiconductor device 100A can be an integrated circuit in which all the transistors have the same conductivity type.

Modification Example 2

Figure 11:
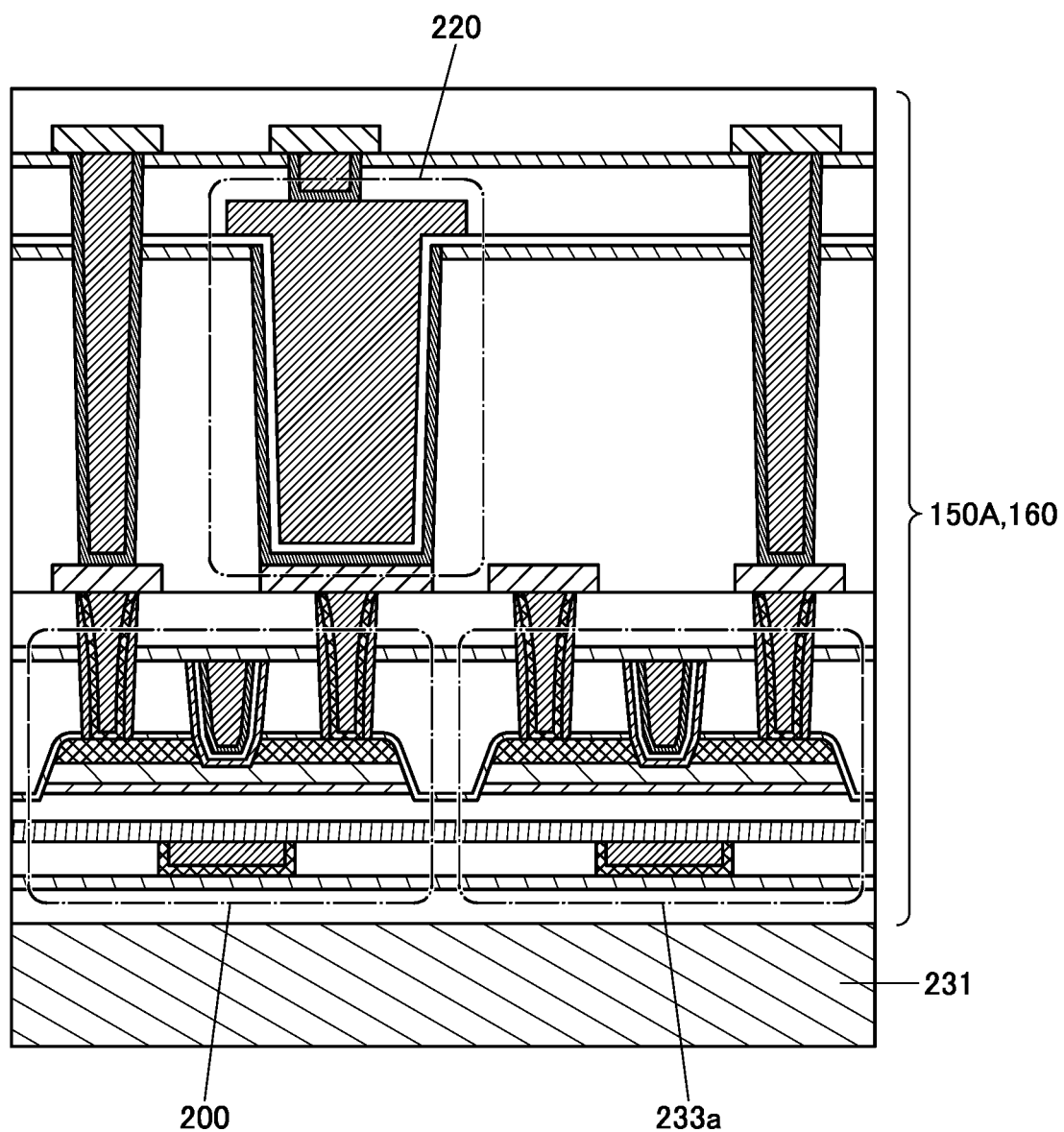
FIG. 11 A cross-sectional view of a semiconductor device 100B.

FIG. 11 shows a semiconductor device 100B, which is a modification example of the semiconductor device 100A. In the case where all the transistors included in the semiconductor device 100B are OS transistors, the integrated circuit 150A and the integrated circuit 160 can be fabricated over the substrate 231 through the same steps. Thus, the productivity of the semiconductor device can be increased. In addition, the manufacturing cost of the semiconductor device can be reduced.

When a substrate with high thermal conductivity such as a silicon substrate is used as the substrate 231, the cooling efficiency of the semiconductor device can be improved, as compared with the case where an insulating substrate or the like is used. Consequently, the reliability of the semiconductor device can be improved.

<Constituent Materials>

[Substrate]

There is no great limitation on a material used for the substrate. An insulator substrate, a semiconductor substrate, or a conductor substrate may be used, for example.

Examples of the insulator substrate include a glass substrate, a quartz substrate, a sapphire substrate, a stabilized zirconia substrate (an yttria-stabilized zirconia substrate or the like), and a resin substrate.

Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. In addition, a semiconductor substrate in which an insulator region is included in the above semiconductor substrate, for example, an SOI (Silicon On Insulator) substrate or the like may be used.

As described above, when an integrated circuit is required to operate at high speed, a single crystal semiconductor substrate is preferably used as the substrate.

Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element. Furthermore, a semiconductor substrate on which a semiconductor element such as a strained transistor or a FIN-type transistor is provided, or the like can be used. That is, the substrate is not limited to a simple supporting substrate and may be a substrate where a device such as another transistor is formed.

[Insulating Layer]

Examples of a material used for an insulating layer include an oxide, a nitride, an oxynitride, a nitride oxide, a metal oxide, a metal oxynitride, and a metal nitride oxide, each of which has an insulating property.

As scaling down and high integration of the transistor progress, for example, a problem such as leakage current may arise because of a thinner gate insulating layer. When a high-k material is used for the insulating layer functioning as a gate insulating layer, such an insulating layer enables a reduction in voltage at operation of the transistor while maintaining the physical thickness of the gate insulator. In contrast, when a material with low dielectric constant is used as an insulator functioning as an interlayer insulating film, parasitic capacitance generated between wirings can be reduced. Thus, a material is preferably selected in accordance with the function of an insulating layer.

In addition, examples of the insulator with high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In the case where an OS transistor is used as the transistor, the transistor is surrounded by an insulating layer (e.g., the insulating layer 365, the insulating layer 371, and the like) having a function of inhibiting transmission of oxygen and impurities such as hydrogen, so that the transistor can have stable electrical characteristics. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulating layer functioning as the gate insulating layer is preferably an insulator including a region containing oxygen released by heating. For example, when a structure is employed in which silicon oxide or silicon oxynitride including a region containing oxygen released by heating is in contact with the semiconductor layer 260, oxygen vacancies included in the semiconductor layer 260 can be compensated for.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

When an oxide semiconductor, which is one kind of metal oxide, is used for the semiconductor layer, the nitrogen concentration in the insulating layer is preferably lowered in order to prevent an increase in the nitrogen concentration in the semiconductor layer. Specifically, the nitrogen concentration in the insulating layer is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferable that at least a region of the insulating layer in contact with the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor greater than or equal to 2.037 and less than or equal to 2.039 (referred to as a first signal), a signal observed at a g-factor greater than or equal to 2.001 and less than or equal to 2.003 (referred to as a second signal), and a signal observed at a g-factor greater than or equal to 1.964 and less than or equal to 1.966 (referred to as a third signal).

For example, as the insulating layer, it is suitable to use an insulating layer whose spin density of a signal due to nitrogen dioxide (NO$_2$) is higher than or equal to $1\times10^{17}$ spins/cm$^3$ and lower than $1\times10^{18}$ spins/cm$^3$.

Note that nitrogen oxide (NO$_x$) including nitrogen dioxide (NO$_2$) forms a state in the insulating layer. The state is positioned in the energy gap of the oxide semiconductor layer. Thus, when nitrogen oxide (NO$_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer and the insulating layer can reduce a shift in the threshold voltage of the transistor.

As an insulating layer that releases a small amount of nitrogen oxide (NO$_x$), for example, a silicon oxynitride layer can be used. The silicon oxynitride layer is a film that releases more ammonia than nitrogen oxide (NO$_x$) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount in the range of the heat treatment temperature in TDS from 50° C. to 650° C. inclusive or from 50° C. to 550° C. inclusive.

Since nitrogen oxide (NO$_x$) reacts with ammonia and oxygen in heat treatment, the use of an insulating layer that releases a large amount of ammonia reduces nitrogen oxide (NO$_x$). At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}$O$_2$ or $^{18}$O$_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Conductive Layer]

For the conductive layer, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide semiconductor that is a kind of metal oxides is used for a semiconductor layer, a stacked-layer structure in which a material containing the above metal element and a conductive material containing oxygen are combined is preferably used for the conductive layer functioning as the gate electrode. In that case, the conductive material containing oxygen is preferably provided on the channel formation region side. When the conductive material containing oxygen is provided on the channel formation region side, oxygen released from the conductive material is easily supplied to the channel formation region. It is particularly preferable to use, for the conductive layer functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

For the conductive material used for a contact plug or the like, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, polyparaphenylene vinylene, or the like can be used.

Note that semiconductor layers may be stacked. In the case of stacking semiconductor layers, semiconductors having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device or the like with high reliability can be provided. A memory device with high output voltage and high withstand voltage can be provided.

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor, the crystalline Si transistor, and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen may be used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5 \times 10^{-7}$ Pa to $1 \times 10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1 \times 10^{-4}$ Pa, further preferably lower than or equal to $5 \times 10^{-5}$ Pa.

[Metal Oxide]

By changing the composition of elements contained in a metal oxide, a conductor, a semiconductor, and an insulator can be formed separately. The metal oxide with conductor properties is referred to as "conductive oxide" in some cases. The metal oxide having semiconductor properties is referred to as "oxide semiconductor" in some cases. The metal oxide having insulator properties is referred to as "insulating oxide" in some cases.

An oxide semiconductor, which is one kind of metal oxide, preferably contains indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor is described.

Note that when the above metal oxide is used in a channel formation region of a transistor, a transistor having high field-effect mobility can be achieved. In addition, the transistor having high reliability can be achieved.

Furthermore, a metal oxide with a low carrier density is preferably used as the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, a metal oxide has a carrier density lower than $8\times10^{11}$ cm$^{-3}$, preferably lower than $1\times10^{11}$ cm$^{-3}$, further preferably lower than $1\times10^{10}$ cm$^{-3}$, and higher than or equal to $1\times10^{11}$ cm$^{-3}$.

The highly purified intrinsic or substantially highly purified intrinsic metal oxide has a low density of defect states and accordingly has a low density of trap states in some cases.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. Moreover, when the channel formation region of the metal oxide includes oxygen vacancies, the transistor tends to have normally-on characteristics. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which the impurities are sufficiently reduced is used in a channel formation region of a transistor, stable electrical characteristics can be given.

Note that as a metal oxide used as a semiconductor of a transistor, a thin film having high crystallinity is preferably used. With use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has a periodic atomic arrangement in a microscopic region (for example, a region within a size of 1 nm to 3 nm inclusive) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used as the semiconductor of the transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU applying a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

[Deposition Method]

An insulating material for forming the insulating layer, a conductive material for forming the conductive layer, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, or an MBE (Molecular Beam Epitaxy) method, or a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With use of a deposition method that does not use plasma at the time of deposition, such as an MOCVD method, an ALD method, or a thermal CVD method, damage is not easily caused on a surface where the film is deposited. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a film formation method not using plasma, such plasma damage is not caused; thus, the yield of memory devices can be increased. Moreover, since plasma damage during film formation is not caused, a film with few defects can be obtained.

In an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a PEALD (plasma enhanced ALD) method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film deposition methods in which a film is deposited by reaction at a surface of an object. Thus, a CVD method and an ALD method are film deposition methods that enable favorable step coverage almost regardless of the shape of an object. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another film deposition method with a high deposition rate, such as a CVD method, in some cases.

Each of a CVD method and an ALD method enables the composition of a film that is to be deposited to be controlled with a flow rate ratio of source gases. For example, by each of a CVD method and an ALD method, a film with a certain composition can be deposited depending on the flow rate ratio of the source gases. Moreover, with each of a CVD method and an ALD method, by changing the flow rate ratio of the source gases while depositing the film, a film whose composition is continuously changed can be formed. In the case of forming a film while changing the flow rate ratio of the source gases, as compared with the case of forming a film with use of a plurality of deposition chambers, the time taken for the film formation can be shortened because the time taken for transfer and pressure adjustment is omitted. Thus, memory devices can be manufactured with improved productivity in some cases.

This embodiment can be implemented in combination with any of the structures described in the other embodiments and the like, as appropriate.

Embodiment 3

In this embodiment, structure examples of a transistor 210A and a transistor 210B that can be used as the transistor 210 will be described with reference to drawings.

Transistor Structure Example 1

Figure 12A:
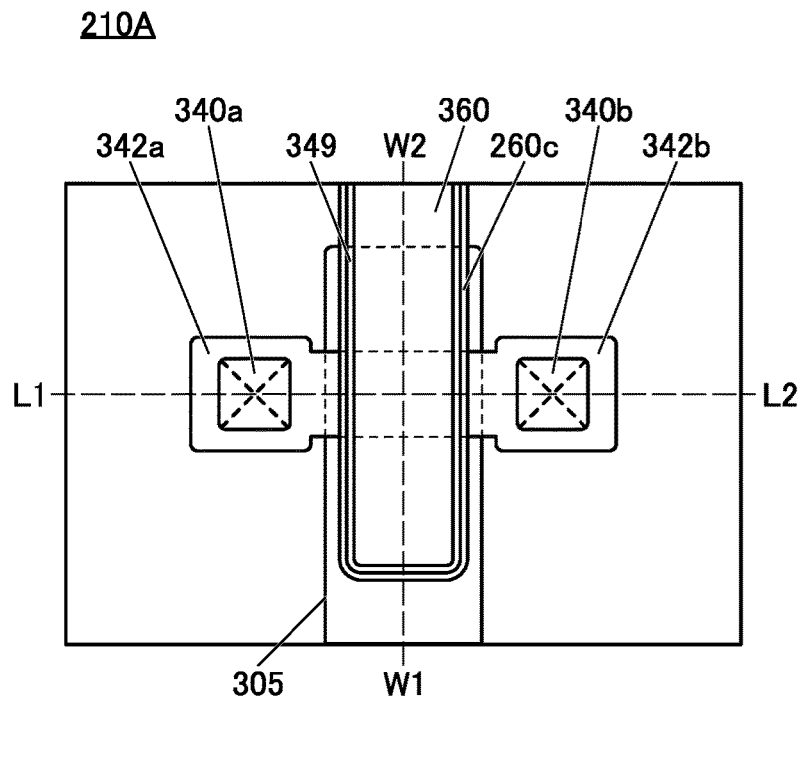
FIG. 12 Diagrams for illustrating an example of a transistor.
Figure 12C:
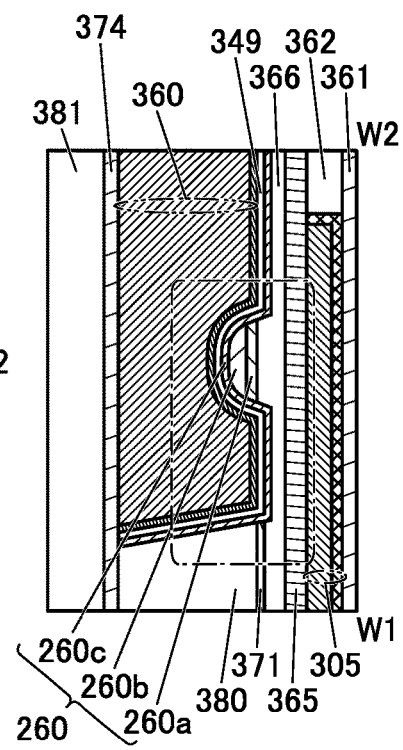
Figure 12B:
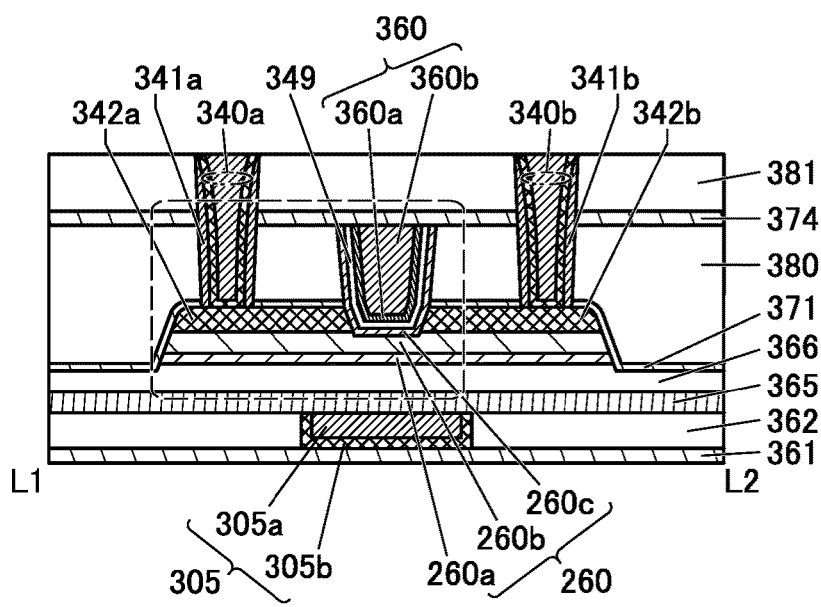

A structure example of the transistor 210A is described with reference to FIGS. 12(A), 12(B), and 12(C). FIG. 12(A) is a top view of the transistor 210A. FIG. 12(B) is a cross-sectional view of a portion indicated by a dashed-dotted line L1-L2 in FIG. 12(A). FIG. 12(C) is a cross-sectional view of a portion indicated by a dashed-dotted line W1-W2 in FIG. 12(A). Note that for simplification of the drawing, some components are not shown in the top view in FIG. 12(A).

FIGS. 12(A), 12(B), and 12(C) show the transistor 210A, the insulating layer 361 functioning as an interlayer insulating layer, an insulating layer 362, the insulating layer 365, the insulating layer 366, the insulating layer 371, the insulating layer 380, the insulating layer 374, and the insulating layer 381. In addition, a conductive layer 340 (a conductive layer 340a and a conductive layer 340b) that is electrically connected to the transistor 210A and functions as a contact plug is shown. Note that an insulating layer 341 (an insulating layer 341a and an insulating layer 341b) is provided in contact with a side surface of the conducting layer 340 functioning as a contact plug.

As the interlayer insulating film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The transistor 210A includes the conductive layer 360 (a conductive layer 360a and a conductive layer 360b) functioning as a first gate electrode; the conductive layer 305 (a conductive layer 305a and a conductive layer 305b) functioning as a second gate electrode; an insulating layer 349 functioning as a first gate insulating film; the insulating layer 365 and the insulating layer 366 that function as a second gate insulating layer; the semiconductor layer 260 (a semiconductor layer 260a, a semiconductor layer 260b, and a semiconductor layer 260c) including a region where a channel is formed; a conductive layer 342a functioning as one of a source and a drain; a conductive layer 342b functioning as the other of the source and the drain; and the insulating layer 371.

The conductive layer 305 is provided to be embedded in the insulating layer 362, and the insulating layer 365 is provided over the insulating layer 362 and the conductive layer 305. The insulating layer 366 is provided over the insulating layer 365. The semiconductor layer 260 (the semiconductor layer 260a, the semiconductor layer 260b, and the semiconductor layer 260c) is provided over the insulating layer 366. The insulating layer 349 is provided over the semiconductor layer 260, and the conductive layer 360 (the conductive layer 360a and the conductive layer 360b) is provided over the insulating layer 349.

The conductive layer 342a and the conductive layer 342b are provided in contact with part of the top surface of the semiconductor layer 260b, and the insulating layer 371 is provided in contact with part of the top surface of the insulating layer 366, the side surface of the semiconductor layer 260a, the side surface of the semiconductor layer 260b, the side surface of the conductive layer 342a, the top surface of the conductive layer 342a, the side surface of the conductive layer 342b, and the top surface of the conductive layer 342b.

The insulating layer 341 is provided in contact with the inner wall of an opening formed in the insulating layer 380, the insulating layer 374, and the insulating layer 381. Moreover, a first conductor of the conductive layer 340 is provided in contact with the side surface of the insulating layer 341, and a second conductor of the conductive layer 340 is further provided on the inner side. Here, the height of a top surface of the conductive layer 340 and the height of a top surface of the insulating layer 381 can be substantially level with each other. Note that although the transistor 210A having a structure in which the first conductor of the conductive layer 340 and the second conductor of the conductive layer 340 are stacked is shown, the present invention is not limited thereto. For example, the conductive layer 340 may be provided as a single layer or a stacked-layer structure of three or more layers. In the case where a structure body has a stacked-layer structure, layers may be distinguished by ordinal numbers corresponding to the formation order.

The semiconductor layer 260 preferably includes the semiconductor layer 260a positioned over the insulating layer 366, the semiconductor layer 260b positioned over the semiconductor layer 260a, and the semiconductor layer 260c that is positioned over the semiconductor layer 260b and at least partly in contact with the top surface of the semiconductor layer 260b. When the semiconductor layer 260a is provided below the semiconductor layer 260b, impurities can be inhibited from diffusing into the semiconductor layer 260b from the structures formed below the semiconductor layer 260a. When the semiconductor layer 260c is provided over the semiconductor layer 260b, impurities can be inhibited from diffusing into the semiconductor layer 260b from the structures formed above the semiconductor layer 260c.

In the transistor 210A, an oxide semiconductor that is a kind of a metal oxide is preferably used for the semiconductor layer 260.

A transistor in which the oxide semiconductor is used in a semiconductor layer where the channel is formed exhibits an extremely low leakage current (off-state current) in the off state. Thus, a semiconductor device with reduced power consumption can be achieved. Since the oxide semiconductor can be formed by a sputtering method or the like, a highly integrated semiconductor device can be easily achieved.

For example, for the semiconductor layer 260, a metal oxide such as In-M-Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, gallium, yttrium, or tin is preferably used as the element M Alternatively, an In-M oxide, an In—Zn oxide, or an M-Zn oxide may be used as the semiconductor layer 260.

In the transistor 210A, the conductive layer 360 functioning as the first gate (top gate) electrode is formed in a self-aligned manner to fill an opening formed in the insulating layer 380 and the like. Forming the conductive layer 360 in this manner allows the conductive layer 360 to be surely positioned in a region between the conductive layer 342a and the conductive layer 342b without alignment.

The conductive layer 360 preferably includes the conductive layer 360a and the conductive layer 360b positioned over the conductive layer 360a. For example, the conductive layer 360a is preferably positioned so as to cover the bottom surface and side surface of the conductive layer 360b. Moreover, as shown in FIG. 12(B), a top surface of the conductor 360 is substantially aligned with a top surface of the insulating layer 349 and a top surface of the oxide 260c.

The conductive layer 305 sometimes functions as a second gate (also referred to as bottom gate) electrode. In that case, by changing the potential applied to the conductive layer 305 not in conjunction with but independently of the potential applied to the conductive layer 360, the threshold voltage (Vth) of the transistor 210A can be controlled. In particular, by applying a negative potential to the conductive layer 305, Vth of the transistor 210A can be higher than 0 V, and its off-state current can be reduced. Thus, drain current at the time when a potential applied to the conductive layer 360 is 0 V can be lower in the case where a negative potential is applied to the conductive layer 305 than in the case where a negative potential is not applied to the conductive layer 305.

For example, the conductive layer 305 and the conductive layer 360 are provided to overlap with the channel formation region of the semiconductor layer 260 provided therebetween, whereby when a voltage is applied to the conductive layer 305 and the conductive layer 360, an electric field generated from the conductive layer 360 and an electric field generated from the conductive layer 305 are connected and can cover the channel formation region of the semiconductor layer 260.

In other words, the channel formation region can be electrically surrounded by the electric field of the conductive layer 360 having a function of the first gate electrode and the electric field of the conductive layer 305 having a function of the second gate electrode. In this specification and the like, the transistor structure in which the channel formation region is electrically surrounded by the electric fields of the first gate electrode and the second gate electrode is referred to as a surrounded channel (S-channel) structure.

The insulating layer 365 and the insulating layer 371 preferably have a function of inhibiting diffusion of hydrogen (for example, at least one of a hydrogen atom, a hydrogen molecule, and the like). In addition, the insulating layer 365 and the insulating layer 371 preferably have a function of inhibiting diffusion of oxygen (for example, at least one of an oxygen atom and an oxygen molecule, and the like). For example, the insulating layer 365 and the insulating layer 371 preferably have a function of inhibiting diffusion of one or both of hydrogen and oxygen than the insulating layer 366. The insulating layer 365 and the insulating layer 371 preferably have a function of inhibiting diffusion of one or both of hydrogen and oxygen than the insulating layer 349. The insulating layer 365 and the insulating layer 371 preferably have a function of inhibiting diffusion of one or both of hydrogen and oxygen than the insulating layer 380.

Note that in this specification and the like, a film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

As shown in FIG. 12(B), the insulating layer 371 is preferably in contact with the top surfaces of the conductive layer 342a and the conductive layer 342b, the side surfaces of the conductive layer 342a and the conductive layer 342b except facing side surfaces of the conductive layer 342a and the conductive layer 342b, the side surfaces of the semiconductor layer 260a and the semiconductor layer 260b, and the part of the top surface of the insulating layer 366. Accordingly, the insulating layer 380 is electrically isolated from the insulating layer 366, the semiconductor layer 260a, and the semiconductor layer 260b by the insulating layer 371. This can inhibit entry of impurities such as hydrogen contained in the insulating layer 380 and the like into the insulating layer 366, the semiconductor layer 260a, and the semiconductor layer 260b.

As shown in FIG. 12(B), the transistor 210A has a structure in which the insulating layer 374 is in contact with the top surfaces of the conductive layer 360, the insulating layer 349, and the semiconductor layer 260c. With such a structure, impurities such as hydrogen contained in the insulating layer 381 and the like can be inhibited from entering the insulating layer 349. Thus, adverse effects on the electric characteristics of the transistor and the reliability of the transistor can be suppressed.

With the above structure, a transistor having a high on-state current can be provided. Alternatively, a transistor with low off-state current can be provided. Alternatively, a semiconductor device that has small variations in electrical characteristics, stable electrical characteristics, and high reliability can be provided.

Transistor Structure Example 2

Figure 13A:
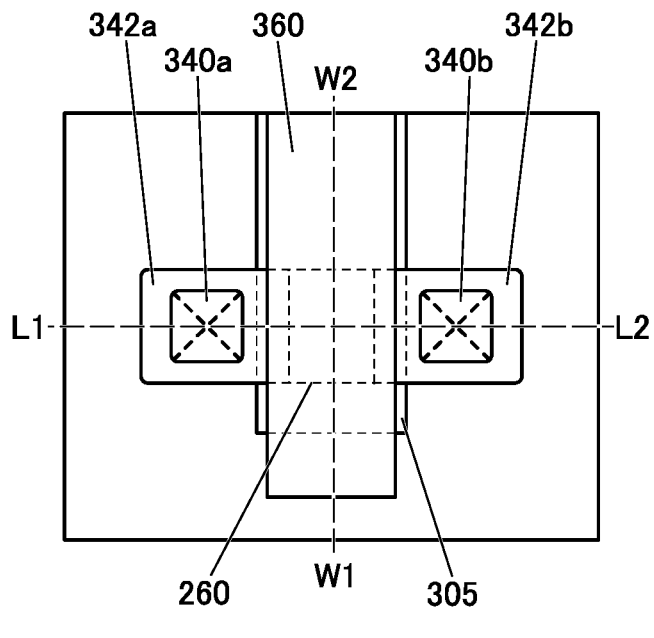
FIG. 13 Diagrams for illustrating an example of a transistor.
Figure 13C:
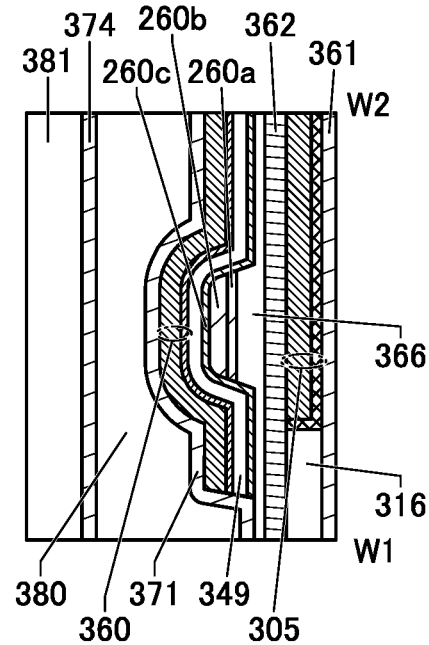
Figure 13B:
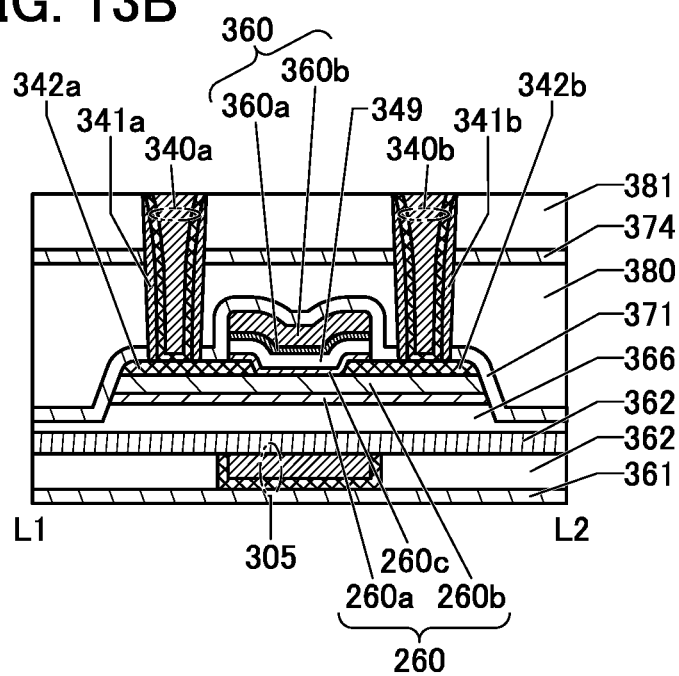

A structure example of a transistor 210B is described with reference to FIGS. 13(A), 13(B), and 13(C). FIG. 13(A) is a top view of the transistor 210B. FIG. 13(B) is a cross-sectional view of a portion indicated by a dashed-dotted line L1-L2 in FIG. 13(A). FIG. 13(C) is a cross-sectional view of a portion indicated by a dashed-dotted line W1-W2 in FIG. 13(A). For clarity of the drawing, some components are not shown in the top view of FIG. 13(A).

The transistor 210B is a variation example of the transistor 210A. Therefore, differences from the transistor 210A are mainly described to avoid repeated description.

The conductive layer 360 functioning as a first gate electrode includes the conductive layer 360a and the conductive layer 360b over the conductive layer 360a. The conductor 360a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 360a has a function of inhibiting oxygen diffusion, the range of choices for the material of the conductive layer 360b can be expanded. That is, the conductive layer 360a inhibits oxidation of the conductive layer 360b, thereby preventing the decrease in conductivity of the conductive layer 360b.

The insulating layer 371 is preferably provided to cover the top surface and the side surface of the conductive layer 360, the side surface of the insulating layer 349, and the side surface of the semiconductor layer 260c. For the insulating layer 371, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 371 is provided, whereby oxidation of the conductive layer 360 can be inhibited. Moreover, including the insulating layer 371 can inhibit diffusion of impurities such as water and hydrogen contained in the insulating layer 380 into the transistor 210B.

The transistor 210B has the conductive layer 360 overlapping with part of the conductive layer 342a and part of the conductive layer 342b and thus tends to have larger parasitic capacitance than the transistor 210A. Thus, the transistor 210B tends to have a lower operation frequency than the transistor 210A. However, the transistor 210B does not require a step of embedding the conductive layer 360, the insulating layer 349, and the like in the opening formed in the insulating layer 380 and the like; thus, the productivity is higher than that of the transistor 210A.

This embodiment can be implemented in an appropriate combination with the structures described in the other embodiments and the like.

Embodiment 4

Figure 14A:
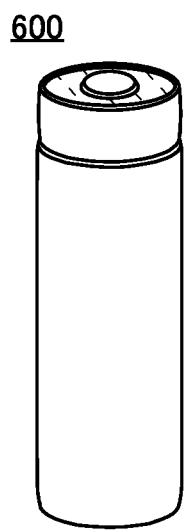
FIG. 14 Perspective views showing an example of a secondary battery.

In this embodiment, a cylindrical secondary battery 600 will be described as an example of the secondary battery 200, with reference to FIG. 14(A) and FIG. 14(B). As shown in FIG. 14(A), the cylindrical secondary battery 600 includes a positive electrode cap (battery lid) 601 on a top surface and a battery can (outer can) 602 on a side surface and a bottom surface. The positive electrode cap (battery lid) 601 and the battery can (outer can) 602 are insulated from each other by a gasket (insulating packing) 610.

Figure 14B:
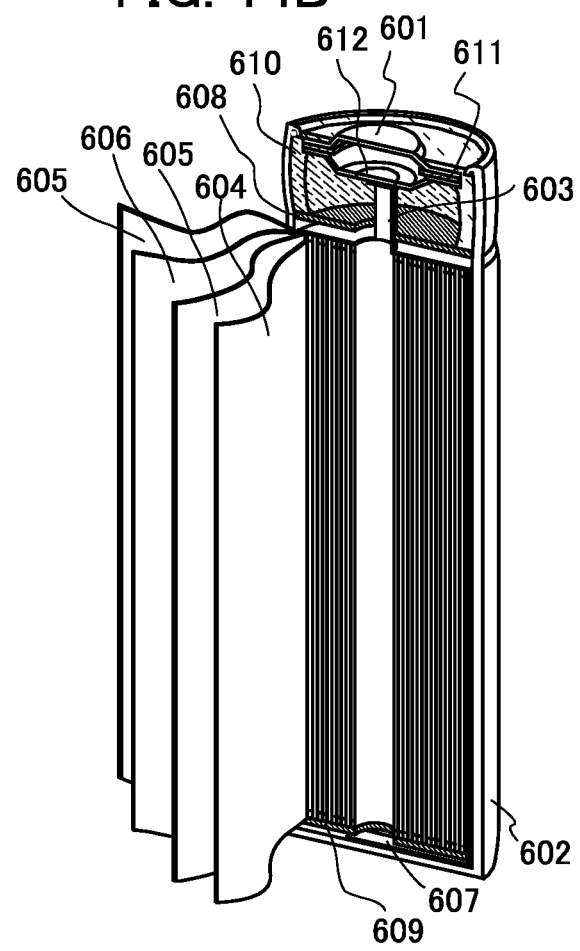

FIG. 14(B) is a diagram schematically showing a cross-section of the cylindrical secondary battery. Inside the battery can 602 having a hollow cylindrical shape, a battery element in which a belt-like positive electrode 604 and a belt-like negative electrode 606 are wound with a separator 605 located therebetween is provided. Although not shown, the battery element is wound centering around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel or the like) can be used. Alternatively, the battery can 602 is preferably covered with nickel, aluminum, or the like in order to prevent corrosion due to the electrolyte solution. Inside the battery can 602, the battery element in which the positive electrode, the negative electrode, and the separator are wound is sandwiched between a pair of insulating plates 608 and 609 that face each other. Furthermore, a nonaqueous electrolyte solution (not shown) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolyte solution in which an electrolyte composed of lithium salt such as $LiBF_4$ or $LiPF_6$ is dissolved in an organic solvent such as ethylene carbonate or diethyl carbonate, and the like.

Since a positive electrode and a negative electrode that are used for a cylindrical storage battery are wound, active materials are preferably formed on both surfaces of a current collector. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a PTC element (Positive Temperature Coefficient) 611. The safety valve mechanism 612 cuts off electrical connection between the positive electrode cap 601 and the positive electrode 604 when the internal pressure of the battery exceeds a predetermined threshold value. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramics or the like can be used for the PTC element.

A lithium-ion secondary battery using an electrolyte solution includes a positive electrode, a negative electrode, a separator, an electrolyte solution, and an exterior body. Note that in a lithium-ion secondary battery, an anode (positive electrode) and a cathode (negative electrode) are interchanged in charging and discharging, and oxidation reaction and reduction reaction are interchanged; thus, an electrode with a high reaction potential is called a positive electrode and an electrode with a low reaction potential is called a negative electrode. For this reason, in this specification and the like, the positive electrode is referred to as a "positive electrode" or a "+ electrode (plus electrode)" and the negative electrode is referred to as a "negative electrode" or a "− electrode (minus electrode)" in either of the case where charging is performed or the case where discharging is performed. The use of terms "anode" and "cathode" related to oxidation reaction and reduction reaction might cause confusion because the anode and the cathode interchange in charging and in discharging. Thus, the terms "anode" and "cathode" are not used in this specification. If the term "anode" or "cathode" is used, it should be clearly mentioned that the anode or the cathode is which of the one in charging or in discharging and corresponds to which of the positive electrode (plus electrode) or the negative electrode (minus electrode).

In this embodiment, an example of a lithium-ion secondary battery is shown; however, it is not limited to a lithium-ion secondary battery and a material including an element A, an element X, and oxygen can be used as a positive electrode material for the secondary battery, for example. The element A is preferably one or more selected from the Group 1 elements and the Group 2 elements. As the Group 1 element, for example, an alkali metal such as lithium, sodium, or potassium can be used. In addition, as the Group 2 element, for example, calcium, beryllium, magnesium, or the like can be used. As the element X, for example, one or more selected from metal elements, silicon, and phosphorus can be used. Furthermore, the element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. In addition, the negative electrode active material layer may contain a conductive additive and a binder.

For a negative electrode active material, an element that enables charge-discharge reaction by alloying reaction and dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon. In particular, silicon has a high theoretical capacity of 4200 mAh/g.

In addition, the secondary battery preferably includes a separator. As the separator, for example, fiber containing cellulose such as paper; nonwoven fabric; glass fiber; ceramics; synthetic fiber using nylon (polyamide), vinylon (polyvinyl alcohol-based fiber), polyester, acrylic, polyolefin, or polyurethane; or the like can be used.

This embodiment can be implemented in combination with any of the structures described in the other embodiments and the like, as appropriate.

Embodiment 5

In this embodiment, electronic devices in which the semiconductor device of one embodiment of the present invention can be used will be described.

The semiconductor device of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. Vehicles such as an automobile, a bicycle, a ship, and an airplane can also be categorized as electronic devices. The semiconductor device of one embodiment of the present invention can be used for a battery charge monitoring device incorporated in any of the electronic devices.

The electronic device may include an antenna. When a signal is received by the antenna, the electronic device can display a video, data, or the like on the display portion. When the electronic device includes the antenna and a secondary battery, the antenna may be used for contactless power transmission.

The electronic device in may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 15A:
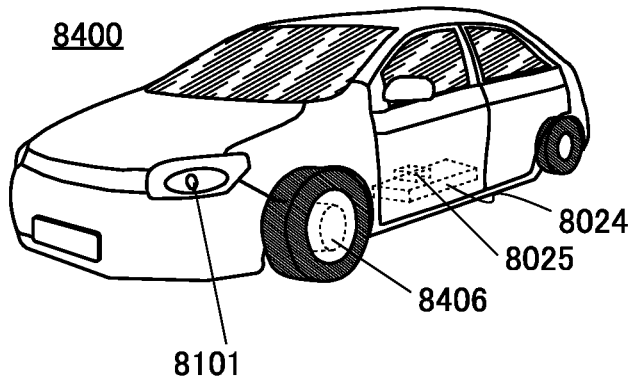
FIG. 15 Diagrams showing examples of an electronic device.

FIG. 15 shows examples of vehicles each using the semiconductor device of one embodiment of the present invention and a secondary battery. A secondary battery 8024 in an automobile 8400 shown in FIG. 15(A) not only drives an electric motor 8406 but also can supply power to a light-emitting device such as a headlamp 8401 or a room light (not shown). A battery module using a plurality of cylindrical secondary batteries 600 shown in FIGS. 14(A) and 14(B) can be used for the secondary battery 8024 in the automobile 8400. A charge monitoring device 8025 includes the semiconductor device of one embodiment of the present invention, and performs charging of the secondary battery 8024 in accordance with the ambient temperature.

Figure 15B:
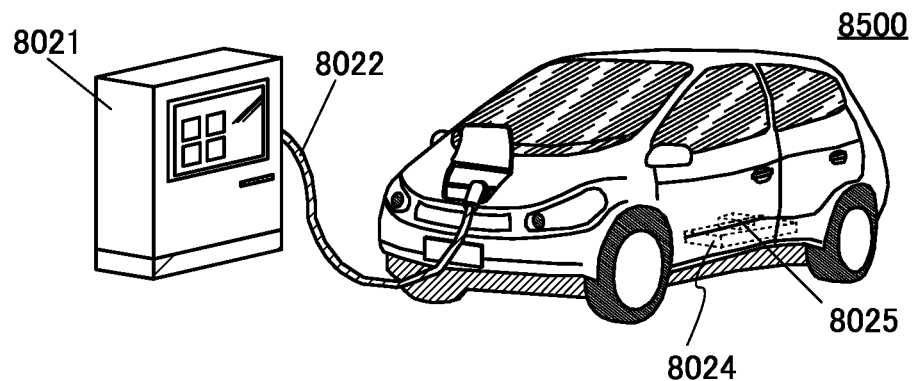

An automobile 8500 shown in FIG. 15(B) includes a secondary battery and can be charged when the secondary battery is supplied with electric power through external charging equipment by a plug-in system, a contactless power feeding system, or the like. FIG. 15(B) shows a state where a secondary battery 8024 incorporated in the automobile 8500 is charged with the use of a ground-based charging device 8021 through a cable 8022. With the charge monitoring device 8025 including the semiconductor device of one embodiment of the present invention, charging can be performed in accordance with the ambient temperature. Note that a charge monitoring device including the semiconductor device of one embodiment of the present invention can be provided in the charging device 8021.

Charging is performed as appropriate by a given method such as CHAdeMO (registered trademark) or Combined Charging System as a charging method, the standard of a connector, or the like. The charging device 8021 may be a charging station provided in a commerce facility or a power source in a house. For example, with a plug-in technique, the secondary battery 8024 incorporated in the automobile 8500 can be charged by power supply from the outside. Charging can be performed by converting AC power into DC power through a converter such as an ACDC converter.

Although not shown, the vehicle may incorporate a power receiving device so that it can be charged by being supplied with electric power from an above-ground power transmitting device in a contactless manner. In the case where this contactless power feeding system is used, incorporation of a power transmitting device in a road or an exterior wall enables charging to be performed not only while the vehicle is parked but also while the vehicle is moving. In addition, the contactless power feeding system may be utilized to perform transmission and reception of electric power between vehicles. Furthermore, a solar cell may be provided on the exterior of the vehicle to charge the secondary battery when the vehicle is parked or moving. For power supply in such a contactless manner, an electromagnetic induction method or a magnetic resonance method can be used.

Figure 15C:
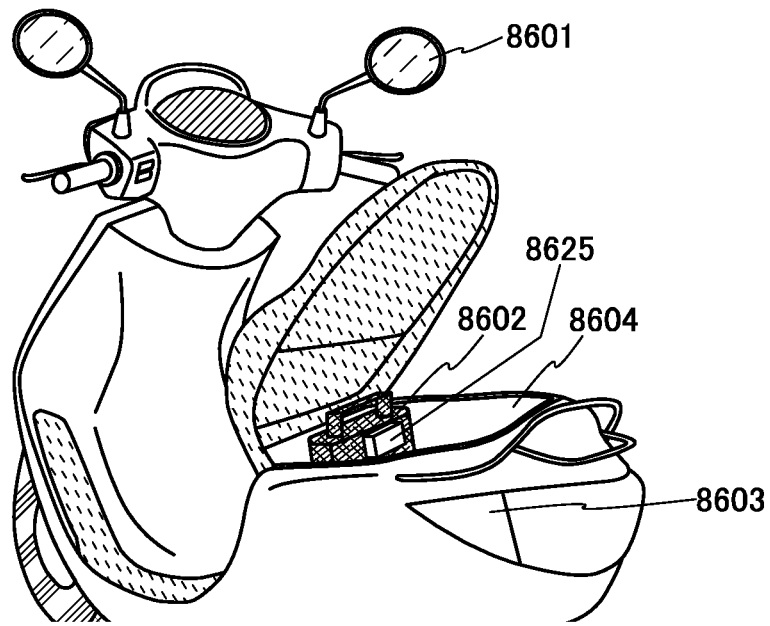

FIG. 15(C) shows an example of a motorcycle including a secondary battery. A motor scooter 8600 shown in FIG. 15(C) includes a secondary battery 8602, a charge monitoring device 8625, side mirrors 8601, and direction indicator lamps 8603. The secondary battery 8602 can supply electricity to the direction indicator lamps 8603. With the charge monitoring device 8025 including the semiconductor device of one embodiment of the present invention, charging of the secondary battery 8602 can be performed in accordance with the ambient temperature.

In the motor scooter 8600 shown in FIG. 15(C), the secondary battery 8602 can be stored in an under-seat storage 8604. The secondary battery 8602 can be stored in the under-seat storage 8604 even when the under-seat storage 8604 is small.

The semiconductor device of one embodiment of the present invention can be used in a device including a secondary battery and a wireless nodule, not being limited to a vehicle.

FIG. 16(A) shows an example of a mobile phone. A mobile phone 7400 includes operation buttons 7403, an external connection port 7404, a speaker 7405, a microphone 7406, and the like in addition to a display portion 7402 incorporated in a housing 7401. Note that the mobile phone 7400 includes a power storage device 7407 and a charge monitoring device of the power storage device 7407.

FIG. 16(B) is a projection diagram for illustrating an example of an external view of an information processing device 1200. The information processing device 1200 described in this embodiment includes an arithmetic device, an input/output device, a housing 1210, a display portion 1230, a display portion 1240, a power storage device 1250, and a charge monitoring device.

The information processing device 1200 includes a communication portion, and has a function of supplying information to a network and a function of obtaining information from the network. In addition, information distributed in a specific area can be received using the communication portion and image data can be generated based on the received information. The information processing device 1200 can function as a personal computer when a screen in which a keyboard is displayed is set as a touch input panel, either in the display portion 1230 or the display portion 1240.

The charge monitoring device of a secondary battery of one embodiment of the present invention may be provided in wearable devices shown in FIG. 16(C).

For example, the charge monitoring device may be provided in a glasses-type device 400 shown in FIG. 16(C). The glasses-type device 400 includes a frame 400a, a display portion 400b, and a wireless module. A temple portion of the frame 400a with curvature may be provided with a power storage device, a charge monitoring device, and a wireless module. The provision of the charge monitoring device can reduce the deterioration of the power storage device and prevent continuous operating time from decreasing. In addition, charging abnormality becomes less likely to occur and the glasses-type device 400 can be safer.

A headset-type device 401 can be provided with a power storage device, a charge monitoring device, and a wireless module. The headset-type device 401 includes at least a microphone portion 401a, a flexible pipe 401b, and an earphone portion 401c. The power storage device, the charge monitoring device, and the wireless module can be provided in the flexible pipe 401b or the earphone portion 401c.

The charge monitoring device can also be provided in a device 402 that can be directly attached to a human body. A power storage device 402b and a charge monitoring device of the power storage device can be provided in a thin housing 402a of the device 402.

The charge monitoring device can also be provided in a device 403 that can be attached to clothing. A power storage device 403b and a charge monitoring device of the power storage device can be provided in a thin housing 403a of the device 403.

The charge monitoring device can also be provided in a watch-type device 405. The watch-type device 405 includes a display portion 405a and a belt portion 405b, and a power storage device and a charge monitoring device of the power storage device can be provided in the display portion 405a or the belt portion 405b.

The display portion 405a can display various kinds of information such as reception information of an e-mail or an incoming call in addition to time.

Since the watch-type device 405 is a type of wearable device that is directly wrapped around an arm, a sensor that measures pulse, blood pressure, or the like of a user can be provided therein. Data on the exercise quantity and health of the user can be stored to be used for health maintenance.

It is also possible to provide a power storage device and a charge monitoring device of the power storage device in a belt-type device 406. The belt-type device 406 includes a belt portion 406a and a wireless power-feeding/power-receiving portion 406b, and the power storage device, the charge monitoring device, and a wireless module can be provided in the belt-portion 406a.

By using the power storage device and the charge monitoring device of the power storage device of one embodiment of the present invention as a power storage device of a daily electronic product, a light and safe product can be provided. Examples of the daily electronic product include an electric toothbrush, an electric shaver, electric beauty equipment, and the like. As power storage devices of these products, small and lightweight power storage devices with stick-like shapes and high capacity are desired in consideration of handling ease for users. FIG. 16(D) is a perspective diagram of a device called a cigarette smoking device (electronic cigarette). In FIG. 16(D), an electronic cigarette 7410 is composed of an atomizer 7411 including a heating element, a power storage device 7414 that supplies power to the atomizer, and a cartridge 7412 including a liquid supply bottle, a sensor, and the like. To improve safety, a charge monitoring device of a power storage device may be electrically connected to the power storage device 7414. The power storage device 7414 shown in FIG. 16(D) includes an external terminal for connection to a charger. When the power storage device 7414 is held, the power storage device 7414 becomes a tip portion; thus, it is desirable that the power storage device 7414 have a short total length and be lightweight.

Note that this embodiment can be combined as appropriate with any of the other embodiments.

REFERENCE NUMERALS

100: semiconductor device, 101: memory element, 102: memory element, 103: comparison circuit, 104: current adjustment circuit, 105: control circuit, 106: input/output circuit, 110: electrode, 112: electrode, 114: insulating layer, 115: insulating layer, 116: insulating layer, 120: electrode, 130: insulating layer, 150: integrated circuit, 152: electrode, 153: electrode, 154: insulating layer, 156: insulating layer, 160: integrated circuit, 200: secondary battery, 210: transistor

The invention claimed is:

1. A semiconductor device comprising a first memory element, a second memory element, a comparison circuit, and a current adjustment circuit,
    wherein the first memory element is configured to retain reference temperature information,
    wherein the second memory element comprises a capacitor and a first transistor comprising an oxide semiconductor in a first semiconductor layer,
    wherein the second memory element is configured to measure ambient temperature, and to retain the ambient temperature as ambient temperature information between one electrode of the capacitor and one of a source electrode and a drain electrode of the first transistor due to a resistance change of the oxide semiconductor,
    wherein the comparison circuit is configured to determine an operation of the current adjustment circuit by comparing the reference temperature information and the ambient temperature information, and
    wherein the current adjustment circuit is configured to supply a current to a secondary battery.

2. The semiconductor device according to claim 1, further comprising a plurality of the first memory elements,
    wherein each of the first memory elements is configured to retain reference temperature information different from each other.

3. The semiconductor device according to claim 1,
    wherein the first semiconductor layer comprises one or both of indium and zinc.

4. The semiconductor device according to claim 1,
    wherein the first memory element comprises a second transistor comprising an oxide semiconductor in a second semiconductor layer.

5. The semiconductor device according to claim 4,
    wherein the second semiconductor layer comprises one or both of indium and zinc.

6. The semiconductor device according to claim 1,
    wherein the secondary battery is a lithium-ion secondary battery.

\* \* \* \* \*